(12) United States Patent
Nishikawa

(10) Patent No.: US 10,678,074 B2
(45) Date of Patent: Jun. 9, 2020

(54) SEMICONDUCTOR OPTICAL AMPLIFIER, METHOD FOR MANUFACTURING SAME, AND OPTICAL PHASE MODULATOR

(71) Applicant: Mitsubishi Electric Corporation, Chiyoda-ku (JP)

(72) Inventor: Satoshi Nishikawa, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/470,441

(22) PCT Filed: Oct. 2, 2017

(86) PCT No.: PCT/JP2017/035811
§ 371 (c)(1),
(2) Date: Jun. 17, 2019

(87) PCT Pub. No.: WO2018/131227
PCT Pub. Date: Jul. 19, 2018

(65) Prior Publication Data
US 2019/0317341 A1    Oct. 17, 2019

(30) Foreign Application Priority Data

Jan. 10, 2017  (JP) .................................. 2017-001669

(51) Int. Cl.
*G02F 1/017* (2006.01)
*H01S 5/042* (2006.01)
(Continued)

(52) U.S. Cl.
CPC ........ *G02F 1/01708* (2013.01); *H01S 5/0425* (2013.01); *H01S 5/1014* (2013.01);
(Continued)

(58) Field of Classification Search
CPC ........... G02F 1/01708; G02F 2201/063; G02F 2203/70; H01S 5/22; H01S 5/50; H01S 5/5027
See application file for complete search history.

(56) References Cited

U.S. PATENT DOCUMENTS 5,103,455 A  *  4/1992  Eichen ...................... H01S 5/50
                                                        257/290
5,200,968 A       4/1993  Kurakake et al.
                      (Continued)

FOREIGN PATENT DOCUMENTS

JP         7-244303 A     9/1995
JP         3100641 B2     8/2000
                (Continued)

OTHER PUBLICATIONS

International Search Report dated Nov. 28, 2017 in PCT/JP2017/035811 filed Oct. 2, 2017.

*Primary Examiner* — Daniel Petkovsek
(74) *Attorney, Agent, or Firm* — Oblon, McClelland, Maier & Neustadt, L.L.P.

(57) ABSTRACT

The present invention relates to a semiconductor optical amplifier, the semiconductor optical amplifier including: a plurality of optical amplification regions arranged in series; a passive waveguide region provided between optical amplification regions; and first and second electrodes provided on an upper surface of each of the optical amplification regions. The passive waveguide region electrically insulates between the first electrodes and between the second electrodes of the adjacent optical amplification regions and optically connects the adjacent optical amplification regions. The semiconductor optical amplifier electrically connects the first electrode and the second electrode of the respective adjacent optical amplification regions so that the plurality of optical amplification regions are electrically connected in cascade, and
(Continued)

feeds power to the optical amplification regions at both ends of arrangements of the plurality of optical amplification regions thereby driving the plurality of optical amplification regions.

18 Claims, 17 Drawing Sheets

(51) Int. Cl.
*H01S 5/10* (2006.01)
*H01S 5/22* (2006.01)
*H01S 5/343* (2006.01)
*H01S 5/50* (2006.01)

(52) U.S. Cl.
CPC ............... *H01S 5/22* (2013.01); *H01S 5/343* (2013.01); *H01S 5/5027* (2013.01); *G02F 2201/063* (2013.01); *G02F 2202/102* (2013.01); *G02F 2202/108* (2013.01); *G02F 2203/50* (2013.01); *G02F 2203/70* (2013.01)

(56) References Cited

U.S. PATENT DOCUMENTS

| 6,625,187 | B1 * | 9/2003 | Ikoma | B82Y 20/00 |
| | | | | 257/103 |
| 2007/0110357 | A1 * | 5/2007 | Forrest | G02B 6/12004 |
| | | | | 385/14 |

FOREIGN PATENT DOCUMENTS

| JP | 2007-194340 A | 8/2007 |
| JP | 2010-50135 A | 3/2010 |

\* cited by examiner

F I G. 1 2
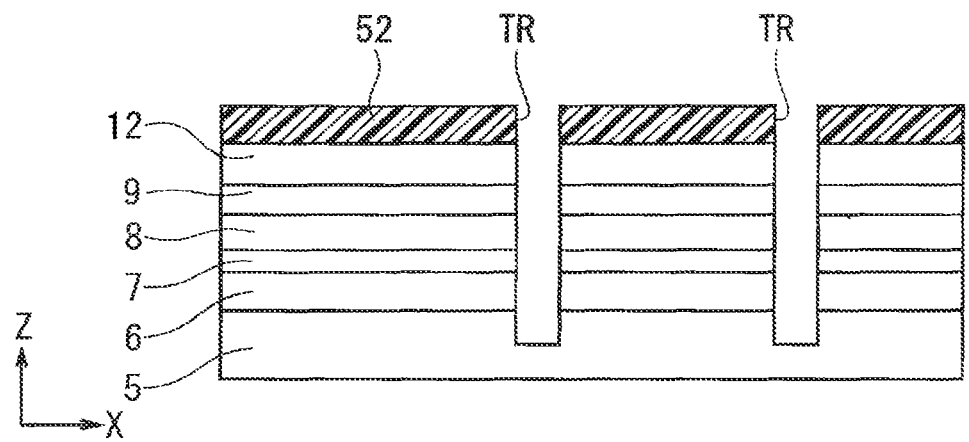
F I G. 1 3
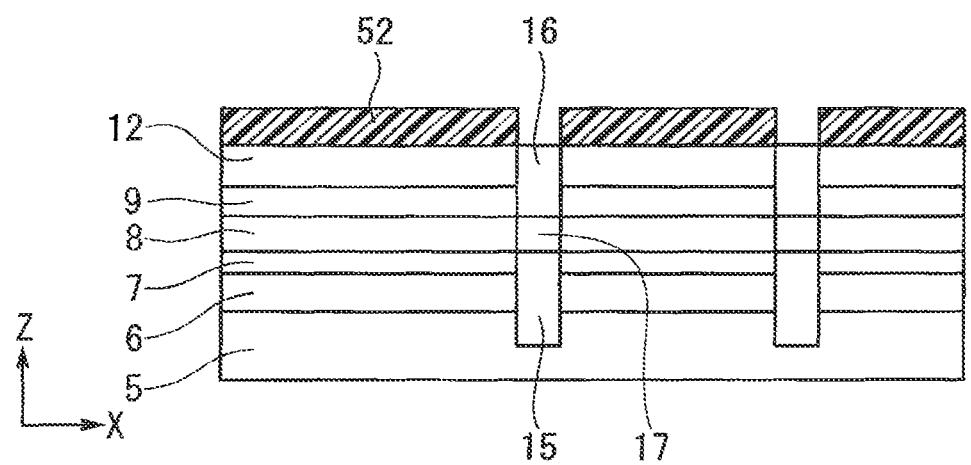
F I G. 1 4
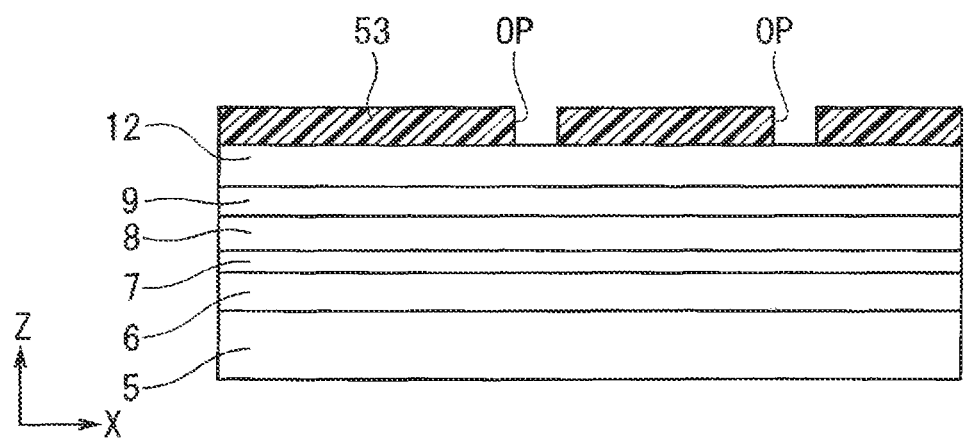

F I G. 2 5
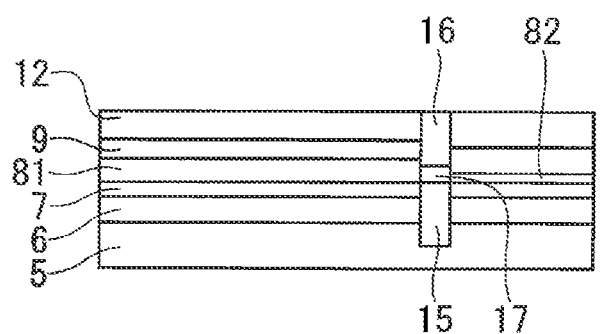

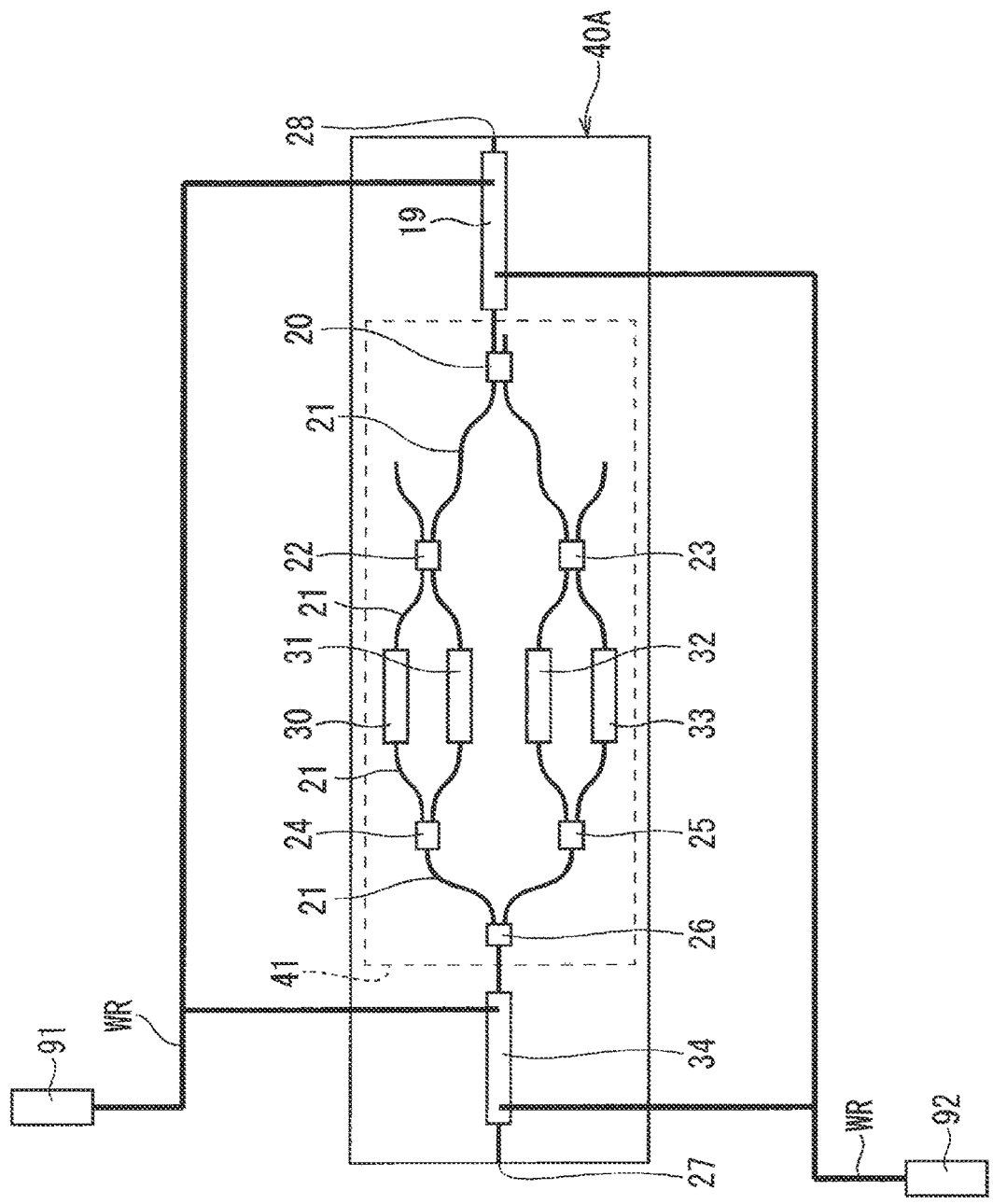
F I G. 3 2

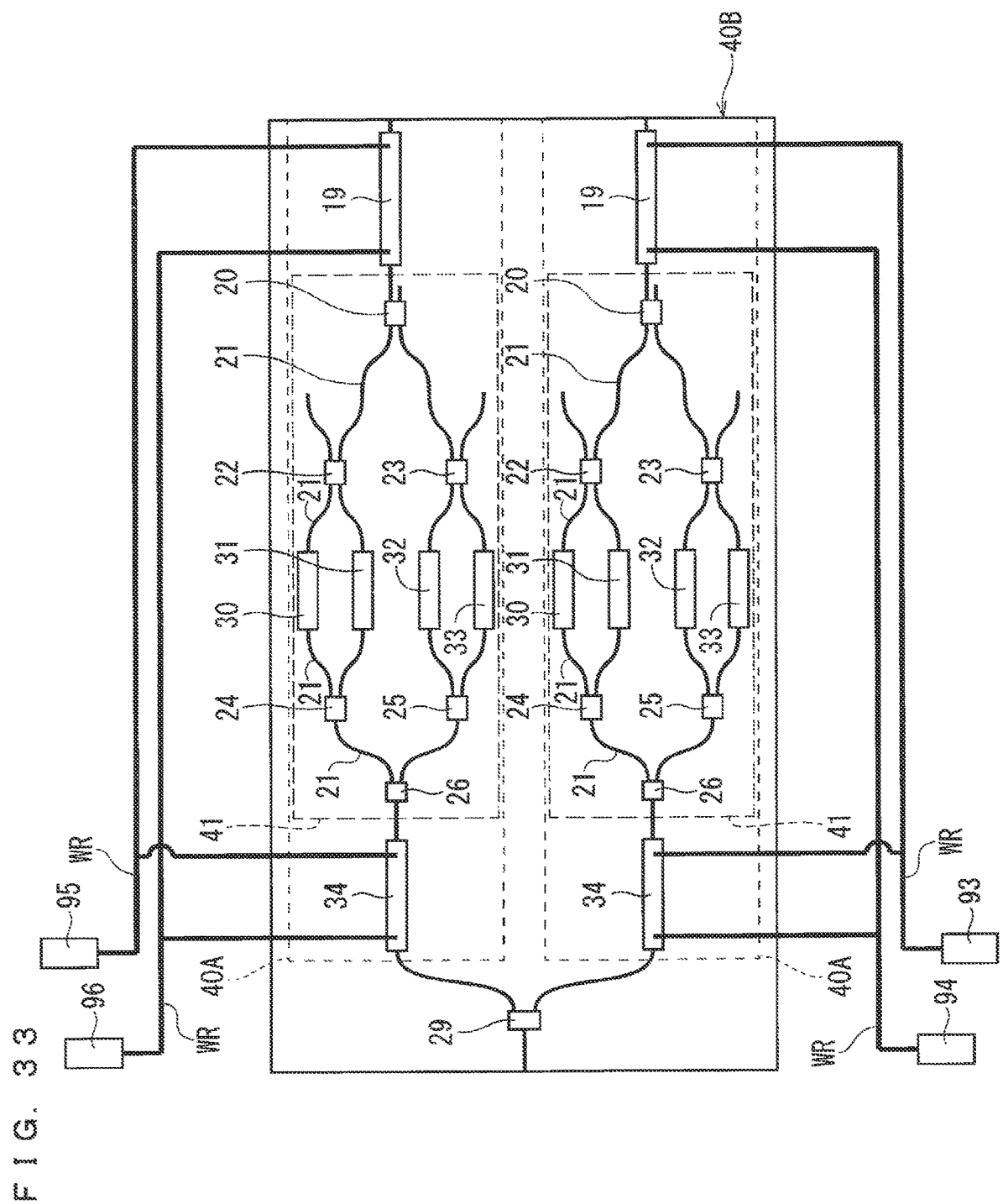
F I G. 3 3

SEMICONDUCTOR OPTICAL AMPLIFIER, METHOD FOR MANUFACTURING SAME, AND OPTICAL PHASE MODULATOR

TECHNICAL FIELD

The present invention relates to a semiconductor optical amplifier for optical communication.

BACKGROUND ART

Along with the drastic increase in communication demand in recent years, a multilevel phase modulation type optical communication system which encodes the phase of light and increases the capacity transmission by multi-valuing the phase of light is put to practical use. As phase modulators used in such a communication system, conventionally, Mach-Zehnder (hereinafter referred to as MZ) type modulators having an apparatus size of several tens mm or more using an electro-optical effect of a dielectric such as lithium niobate ($LiNbO_3$) have been used. In addition, optical amplifiers such as erbium-doped fiber optical amplifiers are used to compensate for attenuation of the light intensity due to a loss caused by inserting a phase modulator in the optical path.

On the other hand, in response to demands for miniaturization of communication apparatuses, semiconductor phase modulators suitable for miniaturization are being actively developed. In the semiconductor phase modulator, for example, in Patent Document 1, an optical integrated device having insertion loss compensated by arranging a semiconductor phase modulator and a semiconductor optical amplifier (hereinafter referred to as SOA) on the same substrate in an integrated manner has been proposed.

Patent Document 1 describes a configuration in which an SOA is arranged in the post stage of the semiconductor MZ type phase modulator to attenuate the incident light due to the insertion loss of the semiconductor MZ type phase modulator. With this configuration, entering strong signal light into SOA is prevented so as to control the gain saturation of SOA. Applications of the SOA include applications for amplifying the intensity of continuous light and applications for amplifying modulated signal light with low distortion, but in any case, since the characteristics may be impaired by gain saturation, the method for controlling gain saturation of the SOA has been developed.

For example, as a method for controlling gain saturation as the SOA alone, for example, Patent Document 2 proposes a configuration in which changing the thickness of the optical guide layer provided adjacent to the active layer of the SOA between the light incident side and the light emission side makes the light confinement coefficient of the active layer on the light incident side larger than the light confinement coefficient of the active layer on the light emission side.

Since the light confinement coefficient is defined by the ratio of the cross-sectional area of the active layer to the spread of light, and the spread of light increases with the thickness of the guide layer on the light emission side where the light confinement coefficient is small, an increase in the photon density in the active layer is controlled, the gain saturation hardly occurs, and a large output light intensity is obtained.

PRIOR ART DOCUMENTS

Patent Documents

Patent Document 1: Japanese Patent Application Laid-Open No. 2010-50135
Patent Document 2: Japanese Patent No. 3100641

SUMMARY

Problem to be Solved by the Invention

The conventional SOA has a problem that the gain saturation occurs when SOA is driven wider strong excitation conditions to obtain large output light intensity in the case of amplification of modulating signal light, the waveform distortion of the optical signal occurs in the case of amplification of intensity modulated light, the phase distortion of the optical signal occurs in the case of amplification of the phase modulated light, and transmission characteristics deteriorate. This problem has been particularly likely to occur in SOAs in which the thickness and width of the active layer core are uniform.

In order to solve this problem, a configuration has been proposed in which the light intensity of the signal light incident on the SOA is weakened as in Patent Document 1, but since the driving condition is limited to the range where gain saturation hardly occurs, there has been a problem that it is difficult to obtain a large output light intensity.

In the configuration in which a difference in the light confinement coefficient is provided between the light incident side and the light emission side of the SOA by changing the thickness of the guide layer of the SOA as in Patent Document 2, controlling the increase in the photon density on the light emission side causes gain saturation to hardly occur and allows the output light intensity to be increased. However, there has been a problem that since a large difference in the light confinement coefficient is needed between the light incident side and the light emission side of the SOA in proportion to the increase in the output light intensity, and the thickness of the guide layer increases on the light emission side, it is difficult to manufacture the SOA.

The present invention has been made to solve the above problems, and it is an object of the present invention to provide a semiconductor optical amplifier having good amplification characteristics with respect to phase modulated light.

Means to Solve the Problem

The semiconductor optical amplifier according to the present invention is a semiconductor optical amplifier provided on a compound semiconductor substrate, the semiconductor optical amplifier including: a plurality of optical amplification regions arranged in series; a passive waveguide region provided between optical amplification regions; and a first electrode and a second electrode provided on an upper surface of each of the optical amplification regions. The passive waveguide region electrically insulates between the first electrodes and between the second electrodes of the adjacent optical amplification regions and optically connects the adjacent optical amplification regions. The semiconductor optical amplifier electrically connects the first electrode and the second electrode of the respective adjacent optical amplification regions so that the plurality of optical amplification regions are electrically connected in cascade, and feeds power to the optical amplification regions at both ends of arrangements of the plurality of optical amplification regions thereby driving the plurality of optical amplification regions.

Effects of the Invention

According to the semiconductor optical amplifier of the present invention, the injection current density can be changed for each optical amplification region, and signal amplification with low distortion can be performed on the phase modulated light.

BRIEF DESCRIPTION OF DRAWINGS

FIG. 12 is a cross-sectional view illustrating a method for forming a passive waveguide.

FIG. 13 is a cross-sectional view illustrating a method for forming a passive waveguide.

FIG. 14 is a cross-sectional view illustrating a method for forming a passive waveguide.

FIG. 25 is a cross-sectional view of an active layer waveguide of a semiconductor optical amplifier according to a third embodiment of the present invention.

FIG. 32 is a schematic diagram showing a configuration of an optical phase modulator according to a fourth modification of the fifth embodiment of the present invention.

FIG. 33 is a schematic diagram showing a configuration of an optical phase modulator according to the fourth modification of the fifth embodiment of the present invention.

DESCRIPTION OF EMBODIMENTS

<At the Beginning>

Prior to the description of the embodiments, the phase distortion when phase-modulated light is amplified by a semiconductor optical amplifier (SOA) will be described. The SOA is required to amplify with small phase distortion while controlling reduction in multiplication gain of light intensity. As phase-modulated signal light, phase signal light generated by a Mach-Zehnder (MZ) type phase modulator is assumed. In the signal light generated by the MZ type phase modulator, the light intensities of two signals temporally adjacent to each other in the phase-added state are the same, but when the phase of the temporally adjacent signal changes, the light intensity decreases. Thus, since the phase modulated light in which the light intensity waveform is a random pattern is incident on the SOA, the carrier density of the active layer fluctuates according to the light intensity pattern. Since the refractive index of the active layer depends on the carrier density, the phase at the time of light transmission fluctuates according to the light intensity pattern, and phase distortion occurs.

First Embodiment

<Device Configuration>

Figure 1:
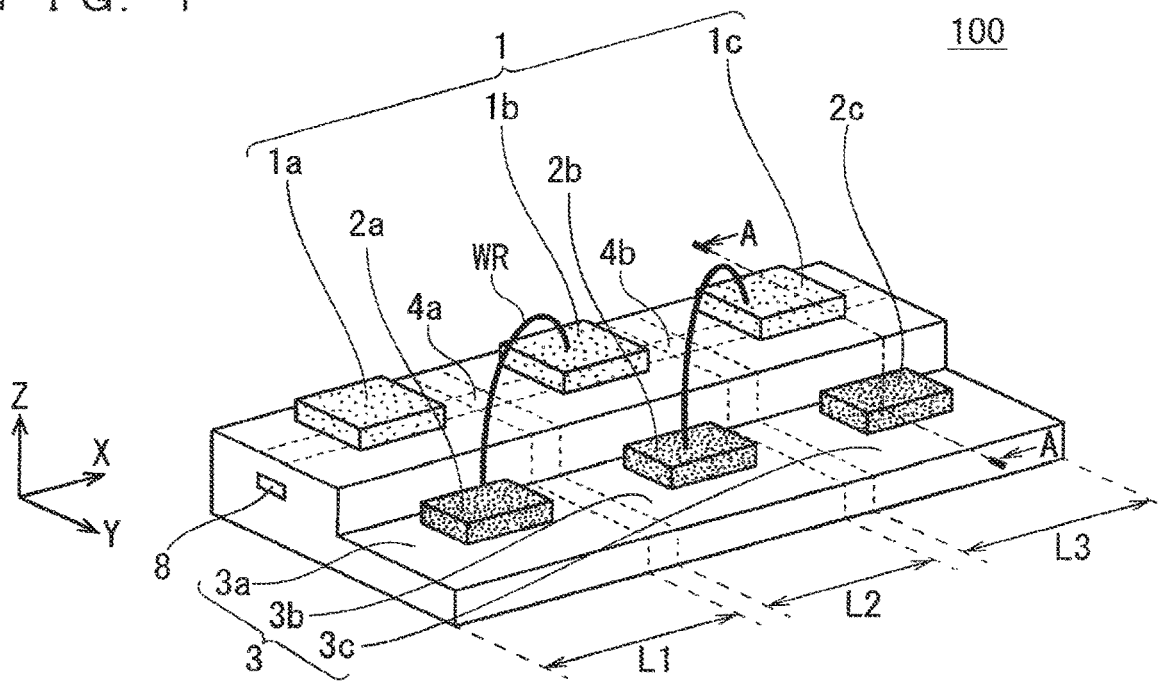
FIG. 1 is a perspective view showing a configuration of a semiconductor optical amplifier according to a first embodiment of the present invention.

FIG. 1 is a perspective view showing a configuration of a semiconductor optical amplifier (SOA) 100 according to a first embodiment of the present invention. The SOA 100 can amplify the incident phase-modulated signal light with small phase distortion and emit it.

As shown in FIG. 1, in the SOA 100, the optical amplification region 3 extending stepwise is divided into optical amplification regions 3a, 3b, and 3c by passive waveguide regions 4a and 4b of electrically high resistance. That is, the passive waveguide regions 4a and 4b are provided at predetermined intervals in the extending direction (X direction) of the optical amplification region 3, whereby the optical amplification regions 3a, 3b, and 3c are defined. In other words, the passive waveguide region 4a is provided between the optical amplification regions 3a and 3b, and the passive waveguide region 4b is provided between the optical amplification regions 3b and 3c.

In each optical amplification region, an active layer 8 extending in the X direction is provided, and each optical amplification region can be said to be an optical waveguide (hereinafter referred to as a waveguide) having the active layer 8 as a core. More specifically, in the stepwise optical amplification region 3, the active layer 8 is provided to extend in the X direction inside the region on the upper stage side, a p-side electrode 1 (first electrode) is provided on the upper surface of the region on the upper stage side, an n-side electrode 2 (second electrode) is provided on the upper surface of the region on the lower stage side, and connecting the p-side electrode 1 and the n-side electrode 2 to the positive and negative outputs of a power supply (not shown), respectively, and injecting a forward current drives the SOA 100 to guide the light by using the active layer 8 as a core.

The optical amplification region 3 is divided by the electrically highly-resistive passive waveguide regions 4a and 4b, whereby the optical amplification regions 3a, 3b, and 3c are configured to be arranged in series. Then, as shown in FIG. 1, the p-side electrode 1 is arranged on the upper surface of the region on the upper stage side of the optical amplification regions 3a, 3b, and 3c respectively as the p-side electrodes 1a, 1b, and 1c, and the n-side electrode 2 is arranged on the upper surface of the region on the lower stage side of the optical amplification regions 3a, 3b, and 3c respectively as the n-side electrodes 2a, 2b, and 2c. With this configuration, the optical amplification regions 3a to 3c are electrically connected in cascade, each of which is an individually driveable optical amplification region, the n-side electrode 2a and the p-side electrode 1b are electrically connected by the wiring line WR, and the n-side electrode 3b and the p-side electrode 1c are electrically connected by the wiring line WR, whereby the optical amplification regions 3a to 3c are connected in series. In FIG. 1, the wiring line WR has a configuration in which gold wires are wire-bonded.

Although FIG. 1 shows a configuration in which three optical amplification regions are provided, the number of optical amplification regions has only to be not less than two. In addition, in FIG. 1, the lengths of the optical amplification regions 3a, 3b, and 3c in the X direction are defined as region lengths, L1, L2, and L3, respectively, and the lengths thereof are defined as the same, but the first embodiment is not limited thereto.

Figure 2:
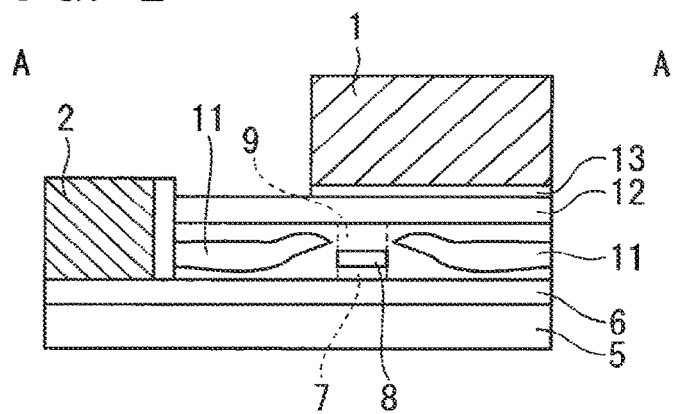
FIG. 2 is a cross-sectional view of the semiconductor optical amplifier according to the first embodiment of the present invention.

FIG. 2 is a cross-sectional view showing a cross section taken along the line A-A in FIG. 1, and since any of the optical amplification regions has the same cross-sectional configuration, the description will be made as a cross section of the optical amplification region 3.

As shown in FIG. 2, the SOA 100 includes a layered film in which an n-type InP layer 6, a lower separate confinement heterostructure (SCH) layer 7, an active layer 8, and an upper SCH layer 9 are layered on a semi-insulating indium phosphide (InP) substrate 5 (compound semiconductor substrate) to which iron (Fe) or the like is added, a block layer 11 for current constriction having the same height as the layered film is arranged on both sides of the layered film, and a p-type InP layer 12 serving as an upper cladding is arranged on the layered film and the block layer 11. A p-type contact layer 13 is arranged on the p-type InP layer 12, and a p-side electrode 1 is arranged on the p-type contact layer 13.

The n-side electrode 2 is arranged on the upper surface of the n-type InP layer 6 apart from the waveguide (active layer waveguide) including the active layer 8. The arrangement position of the n-side electrode 2 is a position at which the light intensity in the waveguide mode is attenuated by not less than two orders of magnitude as compared with the center of the active layer waveguide. Arranging the n-side electrode 2 in this position allows the influence of the electrode on the active layer waveguide to be reduced.

The active layer 8 may include, for example, a multiple quantum well (MQW) layer having an emission wavelength in the C-band wavelength in the vicinity of a wavelength of 1550 nm or a bulk epitaxial layer. The composition of the active layer 8 is suitable for a quaternary compound semiconductor of InGaAsP containing indium (In), gallium (Ga), arsenic (As), and phosphorus (P), or a quaternary compound semiconductor of AlGaInAs containing aluminum (Al), Ga, In, and As, but the composition and wavelength band are not limited to these.

In addition, FIGS. 1 and 2 show an example of the conductivity type of carriers in each semiconductor layer, but a conductivity type in which p-type and n-type are exchanged may be used.

The passive waveguide regions 4a and 4b are nearly transparent waveguides not including the intended gain part and light absorption part, waveguides not including electrodes for current driving or voltage driving either, optically connect adjacent optical amplification regions, and setting the resistance value to be higher than the resistance value in the forward direction when driving the active layer waveguide, for example, not less than 1 kΩ, desirably not less than 10 kΩ, substantially electrically insulates between adjacent optical amplification regions. It should be noted that the configuration of the passive waveguide will be described in detail below.

Here, the forward resistance value of the active layer waveguide depends on the driving condition and the region length of the optical amplification region. As a typical example, when the drive voltage, the drive current, and the region length of the optical amplification region are respectively 1.5 V, 50 mA, and 300 μm, the apparent forward resistance value is 30Ω, but when the region length of the optical amplification region is doubled to 600 μm, the driving voltage and the driving current are respectively 1.5 V and 100 mA, so that the apparent forward resistance value is 15Ω. It should be noted that raising the drive voltage to increase the drive current decreases the apparent forward resistance value. The resistance values of the passive waveguide regions 4a and 4b are set to values larger by not less than one digit than the forward resistance value of the active layer waveguide as described above, and the adjacent optical amplification regions are substantially electrically insulated between each other by the passive waveguide regions 4a and 4b.

Providing the passive waveguide regions 4a and 4b having higher resistance values than the forward resistance value during driving the active layer waveguide and connecting the optical amplification regions 3a, 3b, and 3c in series allows these to be driven with the same current value by using one current source.

Figure 3:
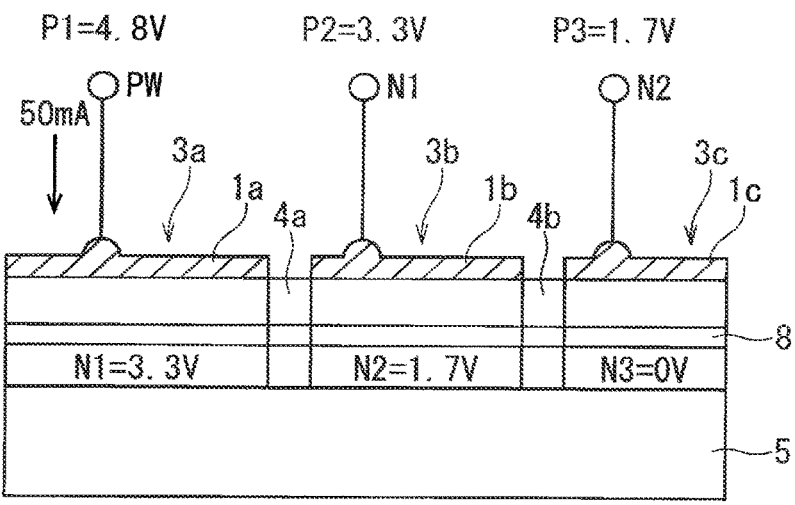
FIG. 3 is a schematic diagram illustrating a mechanism of driving the semiconductor optical amplifier according to the first embodiment of the present invention.

FIG. 3 is a schematic diagram for illustrating a driving mechanism of the SOA 100. FIG. 3 is a schematic cross-sectional view in the extending direction (X direction) of the SOA 100, and schematically shows a state in which optical amplification regions 3a to 3c are arranged to be partitioned by the passive waveguide regions 4a and 4b on the semi-insulating InP substrate 5. It should be noted that in FIG. 3, each region length of the optical amplification regions 3a to 3c is set such that the optical amplification region 3a is the longest and the optical amplification region 3c is the shortest, each region has a different length, and the applied voltages required to obtain the same drive current are different.

The p-side electrodes 1a to 1c are respectively arranged on the upper surfaces of the optical amplification regions 3a to 3c, and voltages P1 (4.8 V), P2 (3.3 V), and P3 (1.7 V) are respectively applied to the p-side electrodes 1a to 1c. It should be noted that the voltage P1 is applied from the external current source PW, but the voltages N1 (3.3 V), N2 (1.7 V), and N3 (0 V) of the respective n-side electrodes 2a, 2b, and 2c (none of which are shown) are voltages caused by the voltage drop. In addition, since the p-side electrodes 1b and 1c are respectively connected to the n-side electrodes 2a and 2b, the voltages N1 (3.3 V) and N2 (1.7 V) are applied to the p-side electrodes 1b and 1c. It should be noted that the above-mentioned number of electrodes and each numerical value are only examples, and the present invention is not limited thereto.

Figure 4:
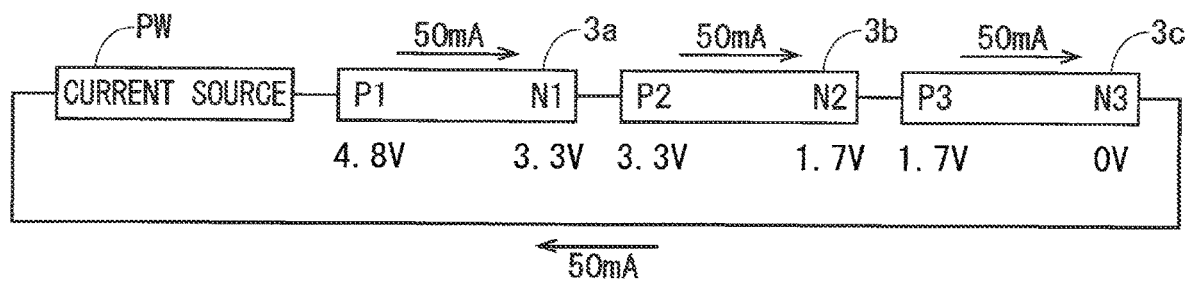
FIG. 4 is a circuit diagram showing a state in which optical amplification regions are connected in series.

FIG. 4 is a circuit diagram showing a state in which the optical amplification regions 3a to 3c are connected in series, and shows that a current of 50 mA is supplied from the current source PW and a current of 50 mA flows through each of the optical amplification regions 3a to 3c It should be noted that the drive voltage applied from the current source PW is the sum of the voltages applied to the respective optical amplification regions.

Thus, in the SOA 100, each optical amplification region is driven with the same current, and the drive current can be reduced and the drive voltage can be increased as compared with the configuration in which all the optical amplification regions are driven in parallel.

Here, the power consumption will be considered. Since the power consumption in the SOA is equal to the product of the drive current through the SOA and the drive voltage applied to the SOA, there is no difference between the case where the optical amplification regions are connected in parallel and the case where they are connected in series. However, since the power consumption including the external drive circuit (not shown) for feeding the SOA is the product of the drive current and the supply voltage to the circuit, if the supply voltage to the circuit is the same, the power consumption is lower in the configuration in which the drive current is smaller, that is, the configuration in which the optical amplification regions are connected in series. Since the total power consumption is the sum of the power consumption in the SOA and the power consumption of the external drive circuit, the configuration in which the optical amplification regions are connected in series has the effect of reducing power consumption also for the total power consumption.

<SOA of Ridge Waveguide Structure>

Figure 5:
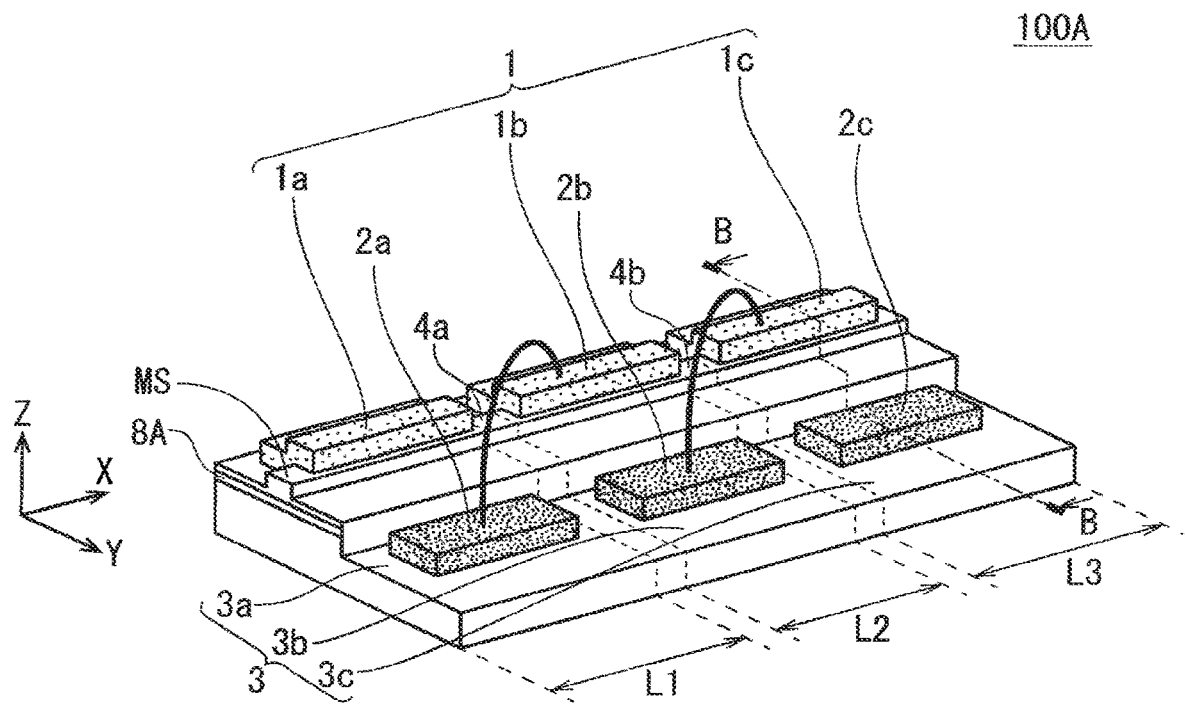
FIG. 5 is a perspective view showing a configuration of a semiconductor optical amplifier having a ridge waveguide structure.
Figure 6:
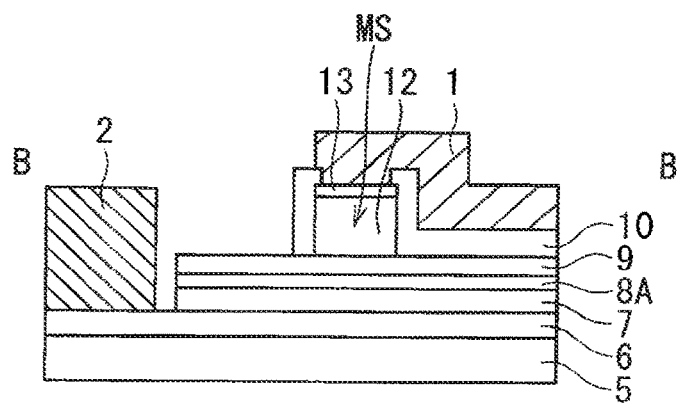
FIG. 6 is a cross-sectional view showing a configuration of a semiconductor optical amplifier having a ridge waveguide structure.

The SOA 100 described above shows an example of a buried waveguide structure as a cross-section structure, but the application of the present invention is not limited to the SOA of the buried waveguide structure, and the present invention can be applied to the SOA of the ridge waveguide structure shown in FIGS. 5 and 6.

FIG. 5 is a perspective view showing a configuration of the SOA 100A having the ridge waveguide structure, and FIG. 6 is a cross-sectional view showing a cross section taken along the line B-B in FIG. 5, but since any of the optical amplification regions has the same cross-sectional structure, FIG. 6 will be illustrated as a cross section of the optical amplification region 3. It should be noted that in FIGS. 5 and 6, the same components as those of the SOA 100 described with reference to FIGS. 1 and 2 are denoted by the same reference numerals, and overlapping descriptions will be omitted.

As shown in FIG. 5, the SOA 100A is the same as the SOA 100 shown in FIG. 1 in the configuration in which the optical amplification region 3 extending stepwise is divided into the optical amplification regions 3a, 3b, and 3c by the electrically highly-resistive passive waveguide regions 4a and 4b, the active layer 8A provided in each optical amplification region is provided in a region on the upper stage side of the optical amplification region 3 so as to have a width spreading over the entire region in the width direction (Y direction) of the region. Then, a mesa portion MS is provided so as to protrude from the upper surface of the upper stage side of the optical amplification region 3 at a position corresponding to the upper part of the active layer 8A. The mesa portion MS extends along the extending direction (X direction) of the optical amplification region 3, and the p-side electrodes 1a, 1b, and 1c are provided so as to cover at least the upper portion of the mesa portion MS. It should be noted that the passive waveguide regions 4a and 4b are also provided so as to partition the mesa portion MS.

As shown in FIG. 6, the SOA 100A includes a layered film in which an n-type InP layer 6, a lower SCH layer 7, an active layer 8A, and an upper SCH layer 9 are layered on a semi-insulating InP substrate 5, a p-type InP layer 12 constituting the mesa portion MS arranged on the upper SCH layer 9, and a p-type contact layer 13 arranged on the p-type InP layer 12. Both sides in the width direction of the mesa portion MS including the p-type InP layer 12 and the p-type contact layer 13 are covered with an insulating film 10, and the insulating film 10 is provided to cover up to a part of the upper part of the upper SCH layer 9. The upper part of the p-type contact layer 13 is not covered with the insulating film 10 but is provided to be in contact with the p-side electrode 1, and the p-side electrode 1 is provided so as to cover up to the upper part of the upper SCH layer 9 covered with the insulating film 10.

The n-side electrode 2 is arranged on the upper surface of the n-type InP layer 6 apart from the waveguide (active layer waveguide) including the active layer 8A. The arrangement position of the n-side electrode 2 is a position at which the light intensity in the waveguide mode is attenuated by not less than two orders of magnitude as compared with the center of the active layer waveguide.

In the SOA 100A having such a ridge waveguide structure, carriers are injected from the p-side electrode 1 to a portion of the p-type contact layer 13 not covered with the insulating film 10, and a portion of the active layer 8A directly under the mesa portion MS is excited via the p-type InP layer 12 constituting the mesa portion MS to constitute a waveguide.

The SOA 100 having the buried waveguide structure shown in FIGS. 1 and 2 has an advantage that heat dissipation of the active layer 8 is excellent, characteristics deterioration at high temperature is reduced, and long-term reliability can be secured, but the SOA 100A having the ridge waveguide structure shown in FIGS. 5 and 6 has an advantage that the block layer 11 for current constriction is unnecessary as compared with the buried waveguide structure, and the manufacturing process can be simplified.

<Modification of Arrangement of P-Side Electrode>

Figure 7:
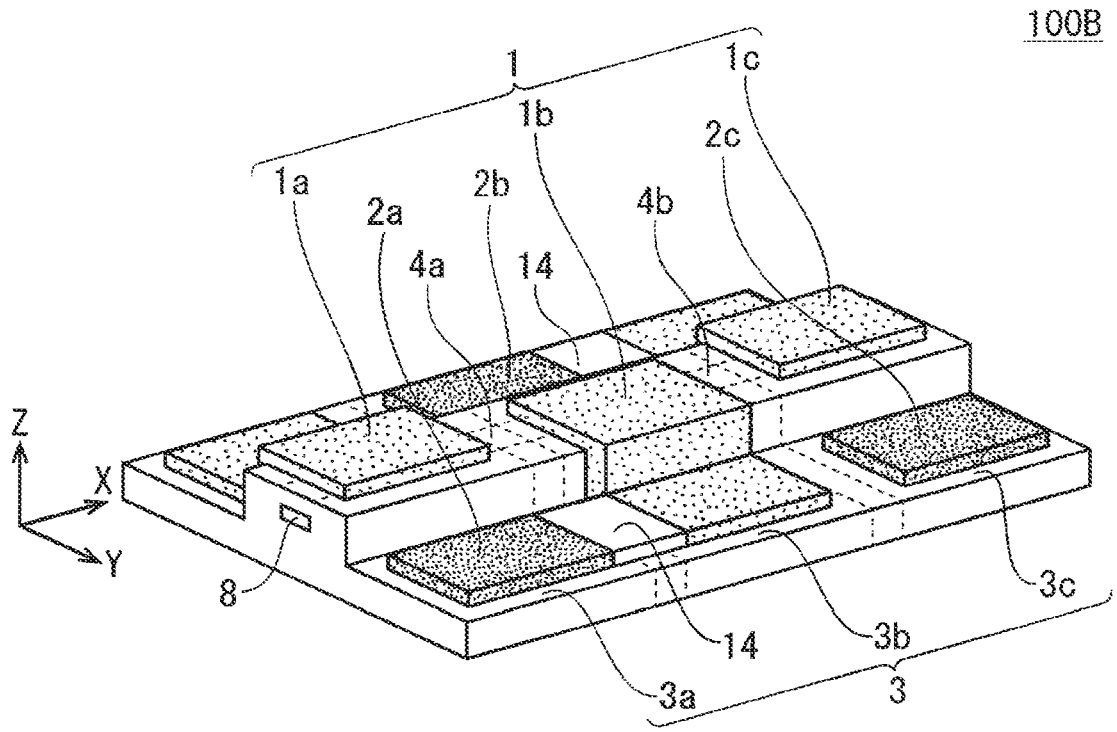
FIG. 7 is a perspective view showing a modification of the arrangement of the p-side electrode.

The SOAs 100 and 100A described above show an example in which the p-side electrode 1 is arranged on the side in the width direction of each optical amplification region, and the n-side electrode 2 is arranged on the opposite side thereof, but the arrangement of the p-side electrode 1 and the n-side electrode 2 is not limited to this, and as in the SOA 100B shown in FIG. 7, the arrangement of the p-side electrode 1 and the n-side electrode 2 may be reversed between adjacent optical amplification regions. It should be noted that in FIG. 7, the same components as those of the SOA 100 described with reference to FIG. 1 are denoted by the same reference numerals, and overlapping descriptions will be omitted.

In the SOA 100B shown in FIG. 7, the stepwise optical amplification region 3 has a configuration in which regions on the lower stage side are provided on both sides in the width direction (Y direction) of the region on the upper stage side. Then, as shown in FIG. 7, in the optical amplification region 3a, the p-side electrode 1a is provided from the upper surface of the region on the upper stage side of the optical amplification region 3a to the upper surface of the region on one lower stage side, and the n-side electrode 2a is provided on the upper surface of the region on the other lower stage side. In addition, in the optical amplification region 3b, the n-side electrode 2b is provided on the upper surface of the region on the lower stage side of the optical amplification region 3b, and the p-side electrode 1b is provided from the upper surface of the region on the upper stage side of the optical amplification region 3b to the upper surface of the region on the other lower stage side. In addition, in the optical amplification region 3c, the p-side electrode 1c is provided from the upper surface of the region on the upper stage side of the optical amplification region 3c to the upper surface of the region on one lower stage side, and the n-side electrode 2c is provided on the upper surface of the region on the other lower stage side. Then, between the n-side electrode 2a and the p-side electrode 1b and between the n-side electrode 2b and the p-side electrode 1c, wiring line patterns 14 for connecting the electrodes are provided.

In this way, arranging the p-side electrode 1 and the n-side electrode 2 alternately in adjacent optical amplification regions allows the wiring line pattern 14 connecting the p-side electrode and the n-side electrode between the adjacent optical amplification regions to be shortened and the resistance of the wiring line to be reduced. In addition, since it is not necessary for the wiring line pattern to go over the waveguide portion, it is possible to reduce the possibility of troubles that may occur in the manufacturing process, such as disconnection of the wiring line pattern. It should be noted that instead of providing the wiring line pattern 14, one of the adjacent p-side electrode 1 and n-side electrode 2 may be extended so as to be connected to the other.

<Configuration of Passive Waveguide>

Figure 8:
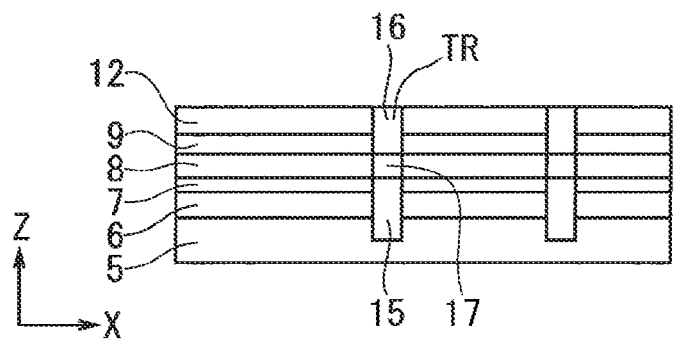
FIG. 8 is a cross-sectional view illustrating a configuration of a passive waveguide.

Next, a sectional configuration of the passive waveguide will be described with reference to a cross-sectional view in the extending direction of the optical amplification region 3. FIG. 8 is a cross-sectional view at the central part, in the width direction of the active layer 8 of the waveguide (active layer waveguide) including the active layer 8, and for convenience, the p-type contact layer 13 and the p-side electrode 1 are omitted to be shown. As shown in FIG. 8, an n-type InP layer 6, a lower SCH layer 7, an active layer 8, an upper SCH layer 9, and a p-type InP layer 12 are layered on the semi-insulating InP substrate 5, and each of the passive waveguide regions 4a and 4b is formed by embedding a multilayer film in a trench TR provided so as to reach the InP substrate 5 from the outermost surface of the p-type InP layer 12.

That is, in the trench TR, the lower i-InP layer 15, the transparent waveguide core layer 17 (transparent waveguide) having the same thickness as the active layer 8, and the upper i-InP layer 16 are layered in this order from the bottom surface side, the thickness of the lower i-InP layer 15 is adjusted so that the positions in the height direction (Z direction) of the transparent waveguide core layer 17 and the active layer 8 are aligned, and the thickness of the upper i-InP layer 16 is adjusted so that its upper surface is aligned with the outermost surface of the p-type InP layer 12.

The transparent waveguide core layer 17 has a composition such that the emission wavelength is shorter than that of the active layer 8, and for example, a bulk InGaAsP or AlGaInAs quaternary compound semiconductor is suitable. It should be noted that the manufacturing method of the passive waveguide will be described in detail below.

Figure 9:
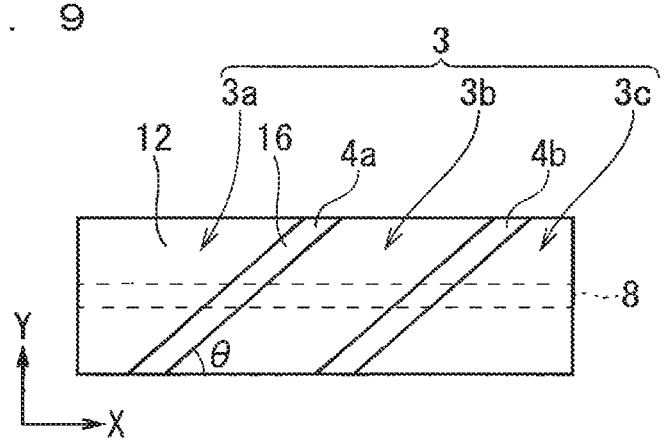
FIG. 9 is a plan view of the waveguide as viewed from the upper surface side.

FIG. 9 is a plan view of the waveguide (active layer waveguide) as viewed from the upper surface side in a state where formation of the passive waveguide is completed. In FIG. 9, the passive waveguide regions 4a and 4b are represented as buried regions of the upper i-InP layer 16, and the optical amplification regions 3a to 3c are represented as regions of the p-type InP layer 12. In addition, the broken line indicates the region where the active layer 8 is formed. It should be noted that the active layer 8 is a refractive index confinement waveguide.

The passive waveguide regions 4a and 4b are formed by buried regrowth due to epitaxial growth, but depending on the epitaxial condition, protrusive protrusions may occur at the boundary between the passive waveguide and the optical amplification region, which tends to be an obstacle during forming the active layer waveguide in a uniform width. Such protrusions are related to the crystal orientation of the substrate, and forming the passive waveguide portion so as to be along a crystal orientation that reduces protrusions at the boundary between the passive waveguide portion and the optical amplification region, for example, (110) direction allows the formation of protrusions to be prevented. It should be noted that in terms of the relation with the long side in which the optical amplification region 3 is parallel to the extending direction (X direction), regarding the direction (110), the passive waveguide regions 4a and 4b are preferably provided so as to be inclined at $\theta=45°$ or $\theta=135°$ in plan view with respect to the long side of the optical amplification region 3. It should be noted that even $\theta=60°$ or $\theta=120°$ other than the above angle has an effect of preventing the formation of protrusions.

In addition, as shown in FIG. 9, providing the passive waveguide regions 4a and 4b to be inclined with respect to the long side of the optical amplification region 3 in plan view causes the interface between the passive waveguide and the optical amplification region to have inclination, which is a desirable configuration also from the viewpoint of preventing reflected return light into the optical amplification region. That is, since the reflected return light into the optical amplification region causes wavelength ripple in the gain spectrum as a result of light wave interference, and affects the spectrum and time waveform of the signal light propagating inside the SOA, it is desirable to prevent reflected return light.

Figure 10:
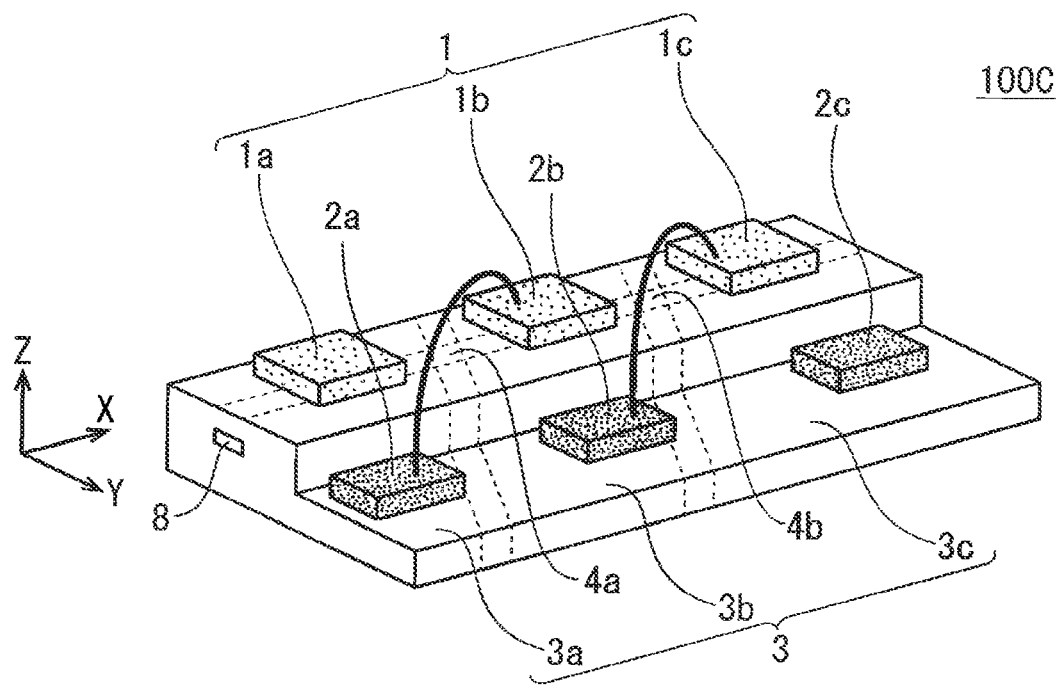
FIG. 10 is a perspective view showing a configuration of a semiconductor optical amplifier when a passive waveguide region is inclined with respect to a long side in plan view.

FIG. 10 is a perspective view showing a configuration of the SOA 100C in which the passive waveguide regions 4a and 4b are provided to be inclined with respect to the long side of the optical amplification region 3 in a plan view. It should be noted that the SOA 100C shown in FIG. 10 is the same as the SOA 100 described with reference to FIG. 1 except that the passive waveguide regions 4a and 4b are provided to be inclined, and overlapping descriptions will be omitted.

<Method for Forming Passive Waveguide>

Next, a method for forming a passive waveguide will be described with reference to FIGS. 11 to 16 being cross-sectional views at the central part in the width direction of the active layer waveguide. First, with reference to FIGS. 11 to 13, a forming method by buried regrowth using epitaxial growth will be described.

Figure 11:
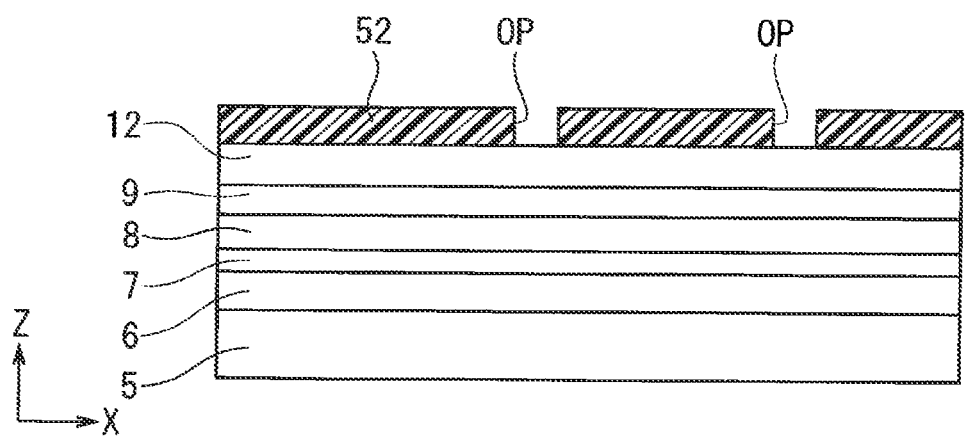
FIG. 11 is a cross-sectional view illustrating a method for forming a passive waveguide.

First, in the process shown in FIG. 11, an n-type InP layer 6, a lower SCH layer 7, an active layer 8, an upper SCH layer 9, and a p-type InP layer 12 are successively formed on the semi-insulating InP substrate 5 by epitaxial growth to form a layered film. It should be noted that since well-known techniques can be used for forming each layer, the description thereof will be omitted. Then, an etching mask 52 such as SiO$_2$ is provided on the formed layered film. In the etching mask 52, the portion corresponding to the formation position of the passive waveguide is the opening portion OP.

Next, in the process shown in FIG. 12, the p-type InP layer 12, the upper SCH layer 9, the active layer 8, the lower SCH layer 7, and the n-type InP layer 6 are successively removed by dry etching using the etching mask 52, and a trench TR reaching the inside of the InP substrate 5 is formed. It should be noted that since well-known techniques can be used for etching each layer, the description thereof will be omitted.

Next, in the process shown in FIG. 13, in a state where the etching mask 52 is formed, regrowing the lower i-InP layer 15, the transparent waveguide core layer 17, and the upper i-InP layer 16 in the trench TR by epitaxial growth referred to as butt joint growth in order from the bottom surface side forms a butt-joint coupled layered film, thereby obtaining highly-resistive passive waveguide regions 4a and 4b. The butt joint coupling is a configuration in which layers having different compositions as in the active layer 8 and the transparent waveguide core layer 17 are coupled to each other. The etching mask 52 is removed after the butt-joint coupled layered film is formed.

Adopting this manufacturing method allows an SOA for amplifying phase modulated light with low distortion to be achieved as a monolithic integrated circuit.

It should be noted that the length (region length) of the passive waveguide regions 4a and 4b in the width direction (X direction) is preferred to be short as long as the optical amplification regions 3a to 3c can be electrically separated and the length is such that epitaxial growth can be performed inside the trench TR, and is set to be a region length such as 30 μm.

Figure 15:
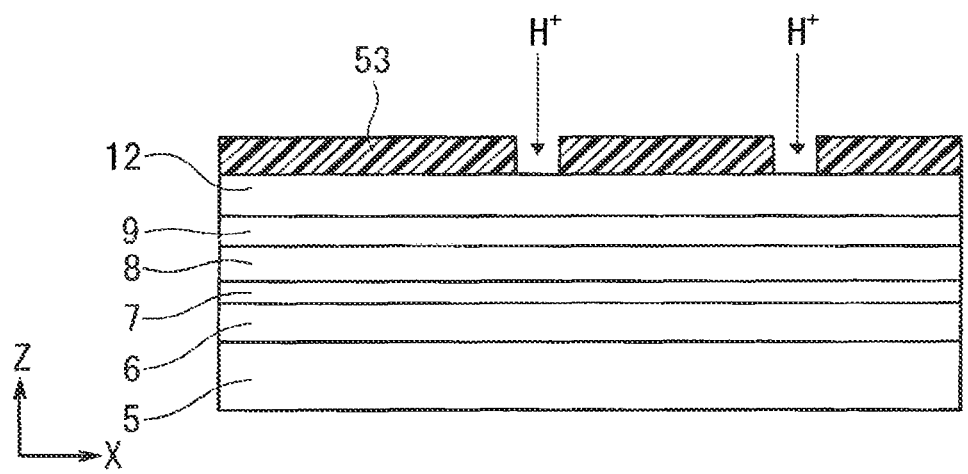
FIG. 15 is a cross-sectional view illustrating a method for forming a passive waveguide.

Next, a method for forming a passive waveguide by ion implantation will be described with reference to FIGS. 14 to 16.

First, in the process shown in FIG. 14, an n-type InP layer 6, a lower SCH layer 7, an active layer 8, an upper SCH layer 9, and a p-type InP layer 12 are successively formed on the semi-insulating InP substrate 5 by epitaxial growth to form a layered film. Then, an ion implantation mask 53 such as SiO$_2$ is provided on the formed layered film. In the ion implantation mask 53, a portion corresponding to the formation position of the passive waveguide is the opening portion OP.

Figure 16:
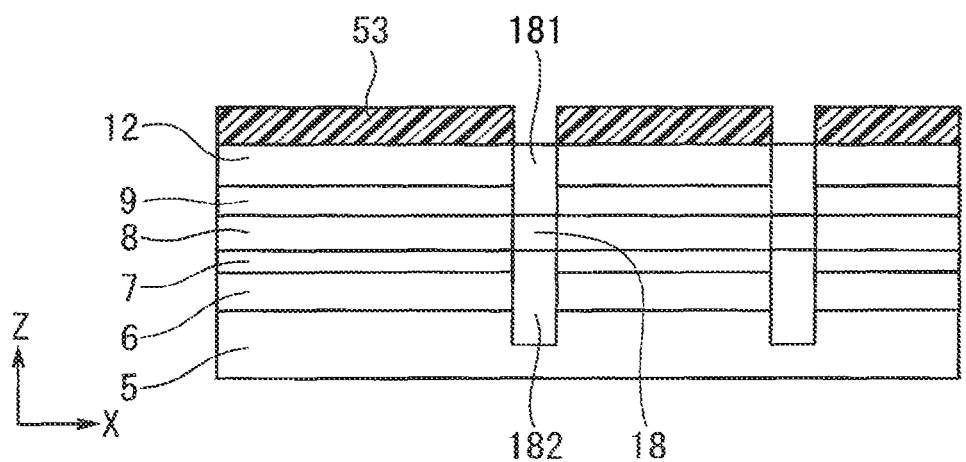
FIG. 16 is a cross-sectional view illustrating a method for forming a passive waveguide.

Next, in the process shown in FIG. 15, as shown in FIG. 16, performing ion implantation such as proton (H$^+$) or helium (He$^+$) from above the ion implantation mask 53 sets the active layer 8 below the opening portion OP as the ion implantation region 18, sets the p-type InP layer 12 and the upper SCH layer 9 below the opening portion OP as the ion implantation region 181, and sets the lower SCH layer 7, the n-type InP layer 6, and a part of the InP substrate 5 below the opening portion OP as the ion implantation region 182. The ion implantation mask 53 is removed after the ion implantation.

Adopting this manufacturing method allows the number of times of epitaxial growth in manufacturing an SOA for amplifying phase modulated light with low distortion to be reduced.

Although the resistance of the ion implantation regions 18, 181, and 182 into which protons or helium ions are implanted is increased, since the refractive index confinement waveguide structure is maintained, a highly-resistive region as in the case of buried regrowth is obtained.

Figure 17:
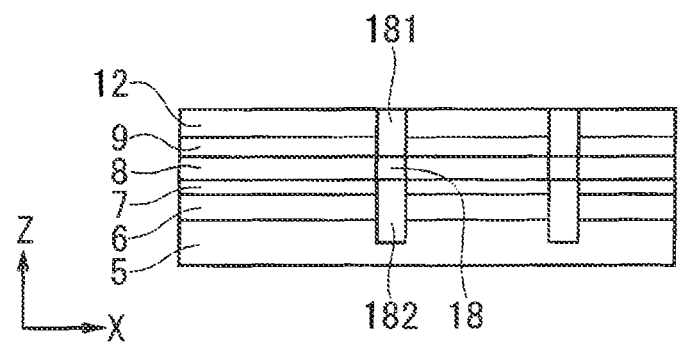
FIG. 17 is a cross-sectional view of an active layer waveguide when a passive waveguide is formed by ion implantation.

FIG. 17 is a cross-sectional view of the active layer waveguide at the central part in the width direction when the passive waveguide is formed by ion implantation, and for convenience, the p-type contact layer 13 and the p-side electrode 1 are not shown.

Figure 18:
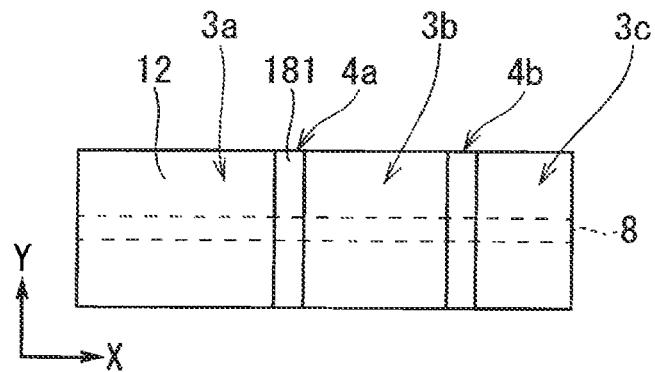
FIG. 18 is a plan view of a waveguide as viewed from the upper surface side.

FIG. 18 is a plan view of the waveguide (active layer waveguide) as viewed from the upper surface side in a state where formation of the passive waveguide is completed. In FIG. 18, the passive waveguide regions 4a and 4b are represented as the ion implantation region 181, and the optical amplification regions 3a to 3c are represented as regions of the p-type InP layer 12. In addition, the broken line indicates the region where the active layer 8 is formed.

When the passive waveguide is formed by ion implantation, since no protrusive protrusions are generated at the boundary between the passive waveguide and the optical amplification region as in the case of forming by buried regrowth, and there is no sharp refractive index change at the interface between the passive waveguide and the optical amplification region, even when the passive waveguide regions 4a and 4b are not inclined with respect to the long side of the optical amplification region 3 in plan view, reflected return light to the inside of the optical amplification region can be reduced.

<Further Reduction in Reflected Return Light>

Examples of a method for reducing reflected return light to the inside of the optical amplification region include a method of forming a low reflection film made of a dielectric multilayer film on the light incident end face and the light emission end face of the SOA by a known method. Examples of the dielectric multilayer film include a multi-layer film in which a high refractive index dielectric (TiO$_2$, Ta$_2$O$_5$, SiN, or the like) and a low refractive index dielectric (Al$_2$O$_3$, SiO$_2$, or the like) are alternately layered.

In addition, in FIG. 9, a configuration in which the passive waveguide regions 4a and 4b are inclined with respect to the long side of the optical amplification region 3 in a plan view is shown, but a method of forming a waveguide (active layer waveguide) including the active layer 8 so as to be inclined with respect to the light incident end face and the light emission end face of the SOA can be mentioned.

Figure 19:
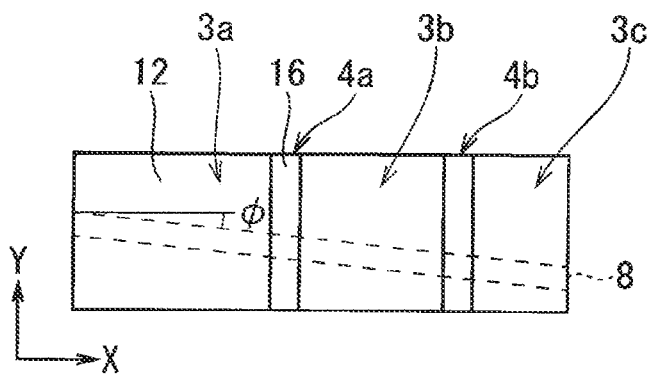
FIG. 19 is a plan view of the active layer waveguide as viewed from the upper surface side when the active layer waveguide is inclined with respect to the light incident end face and the light emission end face.

FIG. 19 is a plan view of the active layer waveguide viewed from the upper surface side when the active layer waveguide is inclined at an angle φ with respect to the light incident end face and the light emission end face of the SOA. In FIG. 19, the passive waveguide regions 4a and 4b are represented as buried regions of the upper i-InP layer 16, and the optical amplification regions 3a to 3c are represented as regions of the p-type InP layer 12. In addition, the broken line indicates the region where the active layer 8 is formed.

As shown in FIG. 19, the active layer 8 is inclined by an angle φ with respect to the light incident end face and the light emission end face of the SOA, and setting the angle φ to about 7° allows the reflected return light from the light incident end face and the light emission end face to the inside of the optical amplification region to be reduced. The larger the inclination angle φ, the more reduced the reflection to the inside of the optical amplification region, but in consideration of adjustment or the like of the coupling between the SOA and the optical fiber, the inclination angle φ is desirably about 7°.

Formation of a waveguide including the active layer 8 (active layer waveguide) includes sequentially epitaxially growing an n-type InP layer 6, a lower SCH layer 7, an active layer 8, and an upper SCH layer 9 on a semi-insulating InP substrate 5 to form a layered film, etching the layered film so as to leave only the waveguide width of the SOA as a mesa, and forming a mesa of the layered film in the form of a waveguide. At this time, the mesa of the waveguide including the active layer 8 is patterned so as to be inclined at an angle φ with respect to the light incident end face and the light emission end face of the SOA. Thereafter, a block layer 11 for current constriction having the same height as the layered film is epitaxially grown on both sides of the mesa of the layered film, and a p-type InP layer 12 is epitaxially grown on the layered film and the block layer 11. It should be noted that the block layer 11 is formed by layering a plurality of compound semiconductor layers such as a p-type InP layer and an n-type InP layer, for example, and at that time, the block layer 11 has a non-uniform multilayer structure as shown in FIG. 2, but since the composition, the manufacturing method, and the like of the block layer 11 are well known, descriptions thereof will be omitted.

<Operation of SOA>

Next, regarding the operation of the SOA of the first embodiment, the result of simulation will be described. In the simulation, a structure suitable for multiplication of phase modulated light with low distortion was studied by making the phase modulated light incident on the SOA, and converting time-series data of the obtained amplified light into the light intensity and a constellation diagram of the phase modulated light for comparison. For the calculation, a commercially available semiconductor laser simulator capable of outputting in chronological order the complex amplitude of the emission light was used. Specifically, the simulation was performed by the following procedure.

Step 1: Assume various structural parameters of the SOA to be calculated.

The assumed structural parameters include waveguide width, waveguide length, cross-sectional structure (active layer thickness, cladding thickness, and the like), driving conditions, and incident light intensity.

Various physical property parameters (refractive index, differential gain, their temperature dependence, and the like) required for calculation are set in advance so that the drive current versus light output characteristics (I-L characteristics) in the simulation is close to the actual measured value.

Step 2: The QPSK phase modulated light of a pseudo-random binary sequence (PRBS) signal at a predetermined symbol rate generated front an ideal phase modulators made incident on the SOA on the simulator.

Step 3: Noise reduction by wavelength filter transmission and noise addition corresponding to receiver noise are applied to the complex amplitude, of output light, and then amplitude and phases are extracted to create constellation data. Furthermore, error vector magnitude (EVM) (error vector amplitude) being an index of data quality is calculated. It should be noted that in the calculation, the symbol rate of the signal light to be input is set as 25.1 GHz, and the wavelength filter is set to have a wavelength width of 1 nm.

Figure 20:
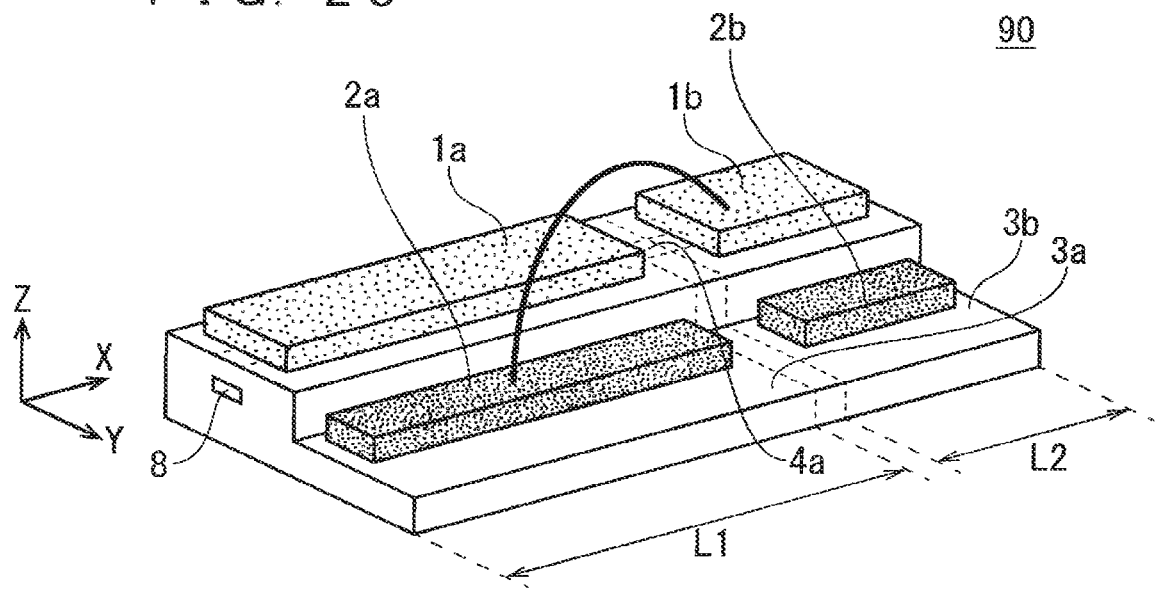
FIG. 20 is a perspective view showing a model of a semiconductor optical amplifier when EVM calculation is performed.

In the above simulation, the SOA 90 including two optical amplification regions as shown in FIG. 20 was calculated as a model. The SOA 90 shown in FIG. 20 includes an optical amplification region 3a on the light incident side and an optical amplification region 3b on the light emission side, and the simulation was performed by setting the optical amplification region length of the optical amplification region 3a to L1 and the optical amplification region length of the optical amplification region 3b to L2, keeping the sum of them constant at 500 μm, and changing the allocation of length. It should be noted that the length of the passive waveguide region 4a was assumed to be 30 μm and an electrical insulator. Each optical amplification region was assumed to be uniform in the light propagation direction, to have a waveguide width of 1.5 μm, and to have a thickness of the active layer 8 of 40 nm in the whole region, and each optical amplification region was assumed to be driven at 50 mA. The incident light intensity was assumed to be 0.1 mW. Both end faces of the SOA 90 were assumed to be anti-reflection film coated.

Figure 21:
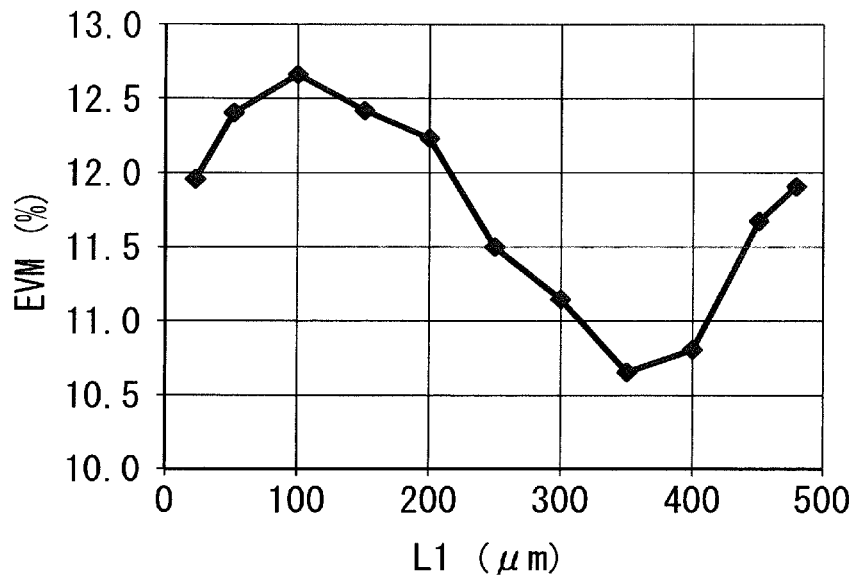
FIG. 21 is a diagram showing a calculation result of the optical amplification region length dependence of EVM of phase modulated amplified light.

FIG. 21 is a diagram plotting the calculation results obtained by changing the length of L1 with the horizontal axis as L1 (μm) and the vertical axis as the EVM value (%). When the length of L1 is in the range of 100 μm to 350 μm, it is understood that the larger the L1 of the optical amplification region 3a on the light incident side and the smaller the L2 of the optical amplification region 3b on the light emission side, the smaller the EVM value, that is, the signal light quality is improved. It should be noted that when the length of L1 is less than 100 μm and the length of L1 exceeds 350 μm, these characteristics are not applicable.

From this, increasing L1 of the optical amplification region 3a on the light incident side and decreasing L2 of the optical amplification region 3b on the light emission side, and for example, based on the result in FIG. 21, setting L1=350 μm and L2=150 μm allows amplified signal light of better quality than that of other combinations of L1 and L2 to be obtained even when the SOA has the same total element length and is driven with the same drive current value.

On the other hand, as can be seen from FIG. 21, the length of L2 showing favorable amplification characteristics has a lower limit, and the ratio of the region length of the SOA at which the EVM is improved is the L1/total SOA region length in the range of 250/500 to 450/500, and a further improved ratio is that in the range of 300/500 to 400/500. This is thought to be because when L2 becomes extremely short, along with saturation of the increase in carrier density of the optical amplification region on the light emission side, decrease in gain due to the short optical amplification region length becomes dominant, and the influence of the optical amplification region on the light emission side becomes relatively small. It is desirable that the length of L2 with respect to the total SOA region length is not less than 1/10 and not more than 1/2, more preferably not less than 1/5 or more and not more than 2/5.

Figure 22:
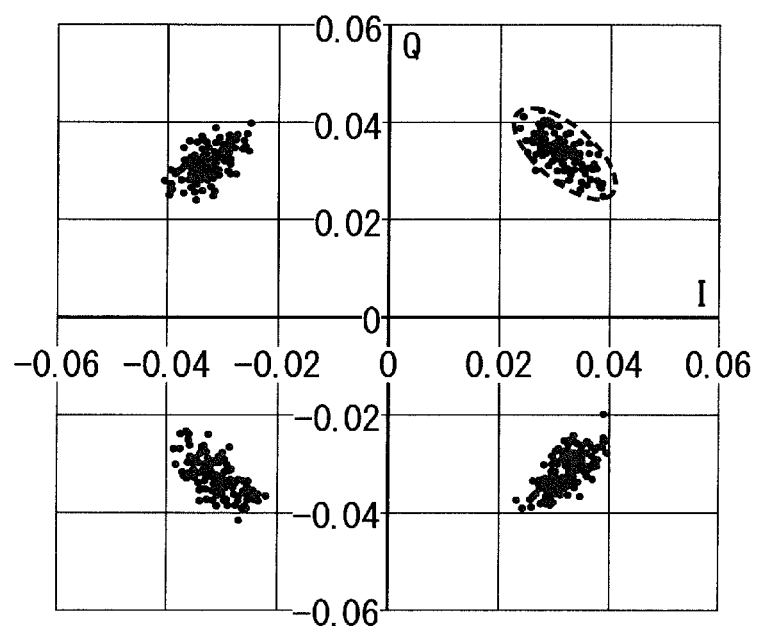
FIG. 22 is a constellation diagram of phase modulated amplified light.
Figure 23:
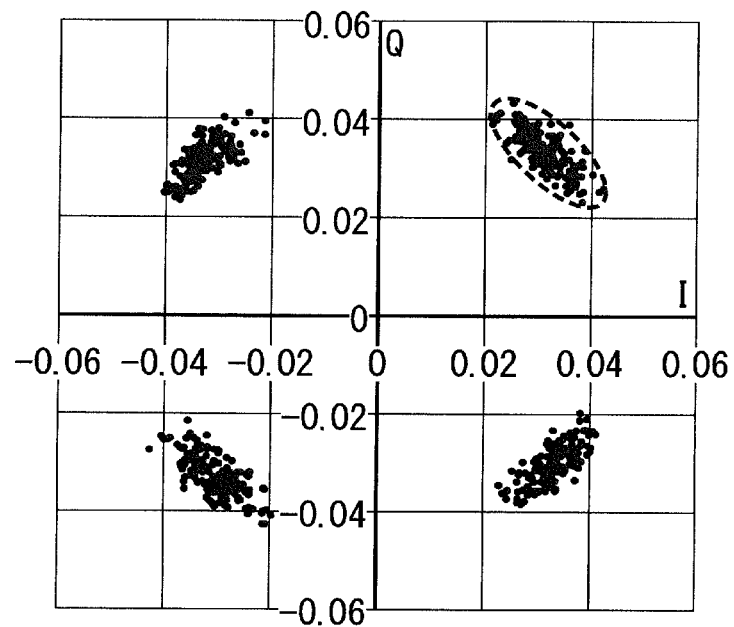
FIG. 23 is a constellation diagram of phase modulated amplified light.

Next, factors for improving the EVM by changing the allocation of the length of each optical amplification region will be described. FIGS. 22 and 23 are plots of the constellation data when the above-described EVM is calculated and the vertical axis and the horizontal axis respectively represent the magnitude of the imaginary part (Q) and the real part (I) of the complex amplitude of the SOA light output extracted at every signal timing of the phase modulation from the time series data of the complex electric field amplitude of the SOA light output obtained by calculation, and are represented in optional units.

Since the quadrature phase shift keying (QPSK) modulated light is amplified, in FIGS. 22 and 23, four phase states coded with different phases by 90° are shown. FIG. 22 shows calculation results in the case of L1=350 μm and L2=150 μm, and FIG. 23 shows calculation results in the case of L1=150 μm and L2=350 μm. The distance from the origin means the light intensity, and there is almost no difference in FIG. 22 and FIG. 23. On the other hand, it is understood that the phase variation spreads in the circumferential direction wider in FIG. 23, and the difference in the EVM is caused by the difference in the phase variation.

In FIGS. 22 and 23, the range of variation of the constellation is shown surrounded by a broken line. The phase variation occurs because the carrier density of the SOA varies depending on the pattern of the light intensity of the incident light, and the refractive index is varied to cause phase distortion. Under the condition in FIG. 22, the region length is small and the volume of the active layer is small in the optical amplification region $3b$ on the light emission side where the light intensity increases and the phase distortion easily occurs due to amplification. Therefore, the injected carrier density is high, and the carrier density recovers at a high speed even if the carrier density in the active layer is reduced by amplifying a signal having a large light intensity. Therefore, fluctuation in the carrier density of the SOA depending on the pattern of the light intensity of the incident light decreases, and the phase distortion of the amplified light decreases. As a result, an SOA with small phase distortion can be obtained.

It should be noted that in the above description, the SOA 90 including two optical amplification regions is modeled, but the number of optical amplification regions is not limited to this and may be larger. In that case, the optical amplification region having the longest region length has only to be arranged on the light incident side of the SOA and the optical amplification region having the shortest region length has only to be arranged on the light emission side of the SOA.

Second Embodiment

Figure 24:
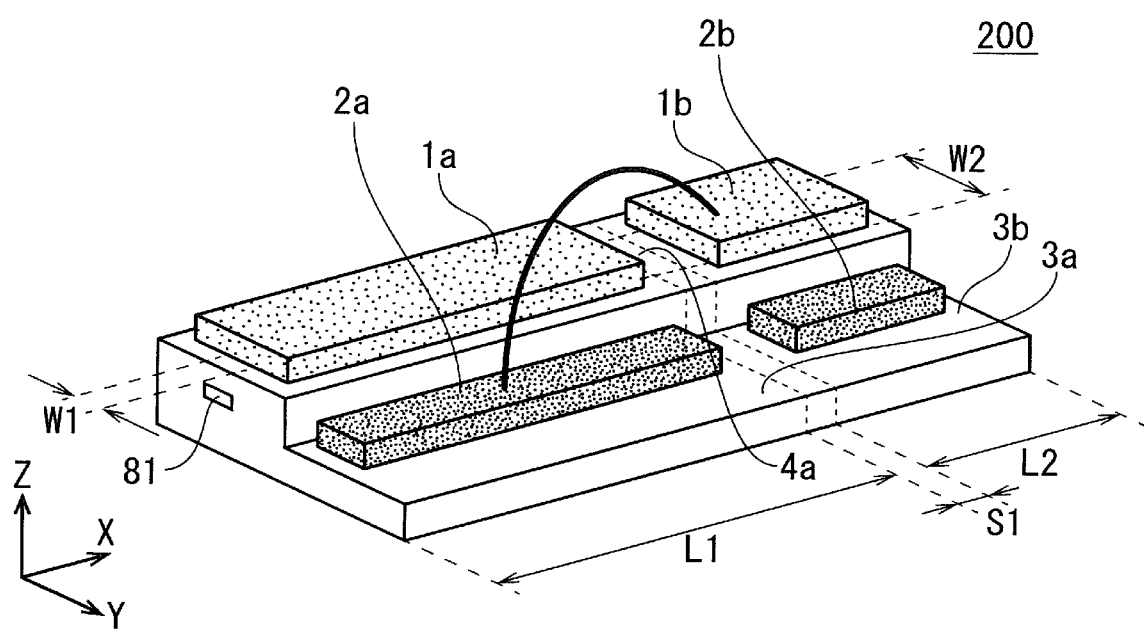
FIG. 24 is a perspective view showing a configuration of a semiconductor optical amplifier according to a second embodiment of the present invention.

FIG. 24 is a perspective view showing a configuration of an SOA 200 according to a second embodiment of the present invention. In SOAs in which a plurality of optical amplification regions are electrically connected in cascade and driven, the SOA 200 has a configuration in which the shape of the waveguide of the optical amplification region and the passive waveguide region has a tapered shape in which the waveguide width increases from the light incident side toward the light emission side.

The SOA 200 shown in FIG. 24 includes an optical amplification region $3a$ on the light incident side and an optical amplification region $3b$ on the light emission side, the optical amplification region length of the optical amplification region $3a$ is set to L1, the optical amplification region length of the optical amplification region $3b$ is set to L2, and the region length of the passive waveguide region $4a$ is set to S1. Then, the shape of the waveguide is tapered so that the waveguide width W1 at the light incident end is 1.5 μm and the waveguide width W2 at the light emission end is 3.0 μm. It should be noted that the waveguide has only to have a linear tapered shape in which the light incident end and the light emission end are connected by a straight line. In addition, the region length S1 of the passive waveguide region $4a$ is set to 30 μm, and the total sum (L1+L2) of the passive waveguide region lengths is set to 500 μm.

In the SOA 200 having the above configuration, in the optical amplification region $3b$ on the light emission side, as the waveguide width increases, the size of the waveguide mode increases and the increase in photon density is reduced, so that the injected carrier fluctuation of the active layer is prevented and the phase distortion of the amplified light is made small.

Thus, with respect to the traveling direction of light in the SOA, in the configuration in which the n-side electrode and the p-side electrode of the adjacent optical amplification regions are electrically connected in cascade and power feeding to the optical amplification regions at both ends drives all the optical amplification regions, the shape of the waveguide of the optical amplification region and the passive waveguide region is set as a tapered shape in which the waveguide width increases from the light incident side toward the light emission side, whereby an SOA with small phase distortion can be obtained.

It should be noted that the tapered shape of the waveguide is effective at least in the optical amplification region closest to the emission end, and the waveguide does not have to be tapered in all the optical amplification regions. It should be noted that the optical amplification region is not limited to a configuration divided into two, and may be divided into not less than three.

Third Embodiment

FIG. 25 is a cross-sectional view at the central part in the width direction of the active layer 8 of the waveguide (active layer waveguide) including the active layer 8 of the SOA 300 of the third embodiment according to the present invention, and for convenience, the p-type contact layer 13 and the p-side electrode 1 are omitted to be shown. In the SOA 300, in SOAs in which a plurality of optical amplification regions are electrically connected in cascade and driven, the light confinement coefficient of the active layer of the waveguide in at least one optical amplification region is different from those in other optical amplification regions, and each optical amplification region is arranged in descending order of decreasing optical confinement coefficient with respect to the traveling direction of light in the optical amplifier.

The SOA 300 shown in FIG. 25 reduces the light confinement coefficient by making the thickness of the active layer 82 of the optical amplification region $3b$ on the light emission end side smaller than the thickness of the active layer 81 of the optical amplification region $3a$ on the light incident end side. By doing so, the volume of the active layer 82 of the optical amplification region $3b$ becomes smaller than the volume of the active layer 81 of the optical amplification region $3a$ by the thickness difference, so that the injected carrier density in the active layer increases with respect to the same injection current. That is, as in the case where the optical amplification region length is shortened, the recovery of carrier density is speeded up. Therefore, fluctuation in the carrier density of the SOA depending on the pattern of the light intensity of the incident light decreases, and the phase distortion of the amplified light decreases. As a result, an SOA with small phase distortion can be obtained. It should be noted that the thickness of the active layer 82 has only to be about ½ to ⅓ of the thickness of the active layer 81, for example. In this case, when the active layer 81 and the active layer 82 have the same width, the light confinement coefficient of the active layer 82 is about ½ to ⅓ of the light confinement coefficient of the active layer 81.

It should be noted that in order to make the thickness of the active layer 82 of the optical amplification region $3b$ on the light emission end side smaller than the thickness of the active layer 81 of the optical amplification region 3a on the light incident end side, an n-type InP layer 6, a lower SCH layer 7, and an active layer 8 are sequentially formed by epitaxial growth on a semi-insulating InP substrate 5, and then an etching mask is formed in which only the active layer 8 in the optical amplification region on the light emission side is an opening portion, and the active layer 8 exposed in the opening portion is removed by etching to a predetermined thickness. After the etching mask is removed, the upper SCH layer 9 and the p-type InP layer 12 have only to be sequentially epitaxially grown on the optical amplification regions on the incident side and the emission side.

Thus, with respect to the traveling direction of light in the SOA, in the configuration in which the n-side electrode and the p-side electrode of the adjacent optical amplification regions are electrically connected in cascade and power feeding to the optical amplification regions at both ends drives all the optical amplification regions, regarding the light confinement coefficient of the active layer in at least one optical amplification region, unlike in other optical amplification regions, arranging each optical amplification region in descending order of decreasing light confinement coefficient with respect to the traveling direction of light in the optical amplifier allows an SOA with small phase distortion to be obtained.

It should be noted that in the above description, the SOA 300 including two optical amplification regions is described, but the number of optical amplification regions is not limited to this and may be larger. In that case, the optical amplification region having the smallest light confinement coefficient of the active layer has only to be arranged so as to be the light emission side of the SOA.

Fourth Embodiment

Figure 26:
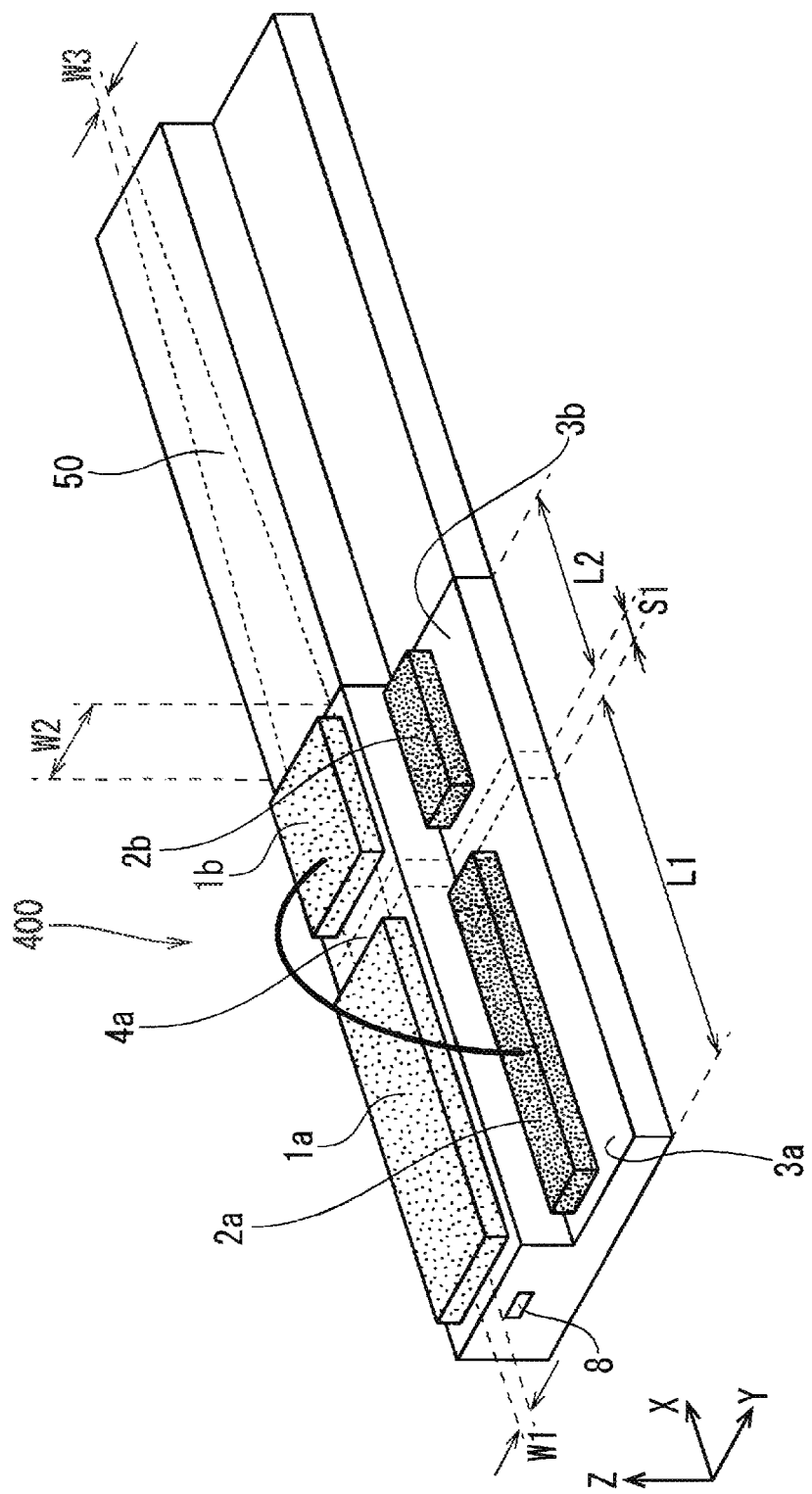
FIG. 26 is a perspective view showing a configuration of a semiconductor optical amplifier according to a fourth embodiment of the present invention.
Figure 27:
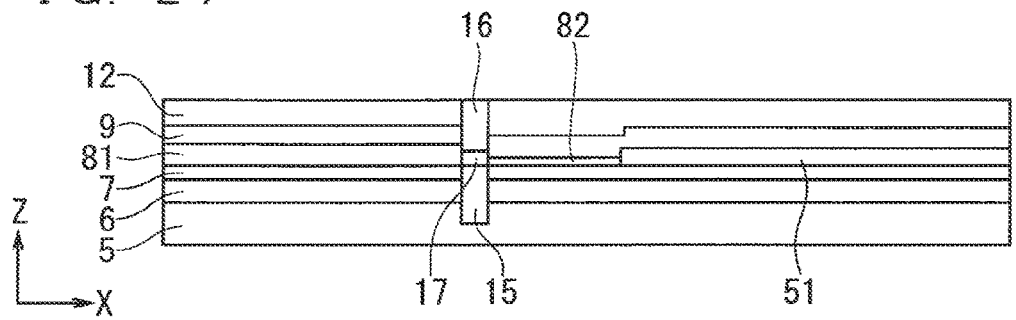
FIG. 27 is a cross-sectional view of an active layer waveguide of a semiconductor optical amplifier according to the fourth embodiment of the present invention.

FIG. 26 is a perspective view showing a configuration of an SOA 400 according to a fourth embodiment of the present invention, and FIG. 27 is a cross-sectional view at the central part in the width direction of the waveguide of the SOA 400. In SOAs in which a plurality of optical amplification regions are electrically connected in cascade and driven, in the SOA 400, the shape of the waveguide of the optical amplification region and the passive waveguide region is a tapered shape in which the waveguide width expands from the light incident side to the light emission side and the light confinement coefficient of the active layer of the waveguide in at least one optical amplification region is not the same as in other optical amplification regions, and each optical amplification region is arranged in descending order of decreasing optical confinement coefficient with respect to the traveling direction of light in the optical amplifier. In addition, a spot size converter 50 is connected to the light emission end of the SOA 400.

The SOA 400 shown in FIG. 26 includes an optical amplification region 3a on the light incident side and an optical amplification region 3b on the light emission side, the optical amplification region length of the optical amplification region 3a is set to L1, the optical amplification region length of the optical amplification region 3b is set to L2, and the region length of the passive waveguide region 4a is set to S1. Then, the shape of the waveguide is a linear tapered shape so that the waveguide width W1 at the light incident end is 1.5 µm and the waveguide width W2 at the light emission end is 3.0 µm. In addition, the region length S1 of the passive waveguide region 4a is set to 30 µm, and the total sum (L1+L2) of the passive waveguide region lengths is set to 500 µm.

In addition, as shown in FIG. 27, the light confinement coefficient is reduced by making the thickness of the active layer 82 of the optical amplification region 3b on the light emission end side smaller than the thickness of the active layer 81 of the optical amplification region 3a on the light incident end side.

Thus, in the SOA 400 according to the fourth embodiment, since the mechanism of reducing the carrier density fluctuation described in the first to third embodiments acts synergistically, the carrier density can be recovered at a higher speed, the carrier density fluctuation of the SOA depending on the pattern of the light intensity of the incident light further decreases, and the phase distortion of the amplified light further decreases.

In addition, connecting the spot size converter 50 to the light emission end of the SOA 400 produces the following effects.

That is, in the structure in which the waveguide width is expanded to the tapered shape like the SOA 400, the shape of the waveguide mode is flattened and the coupling efficiency to the optical fiber is reduced, even if the light intensity to be guided is large. Thus, connecting the spot size converter 50 including the transparent waveguide whose waveguide width is reduced to the reverse tapered shape to the light emission end of the SOA 400 allows the roundness of the waveguide mode shape to be improved and the coupling efficiency to the optical fiber to be improved.

As shown in FIG. 27, forming an InGaAsP-based or AlGaInAs-based bulk layer whose emission wavelength is shorter than that of the active layer of the SOA by butt joint growth in the lower SCH layer 7 to form, a spot size converter core layer 51, growing a current block layer and a contact layer as with the SOA, and forming a buried transparent waveguide allows the spot size converter 50 to be obtained. The waveguide width at the light incident end of the waveguide of the spot size converter 50 is set to be equal to the waveguide width W2 at the light emission end of the SOA 400 and the waveguide width W3 at the light emission end is set to be narrower than the waveguide width W2 at the light incident end. It should be noted that the waveguide width W3 is preferably not more than 0.5 µm.

It should be noted that the spot size converter 50 can be applied not only to the SOA 400 but also to any of the SOAs of the first to third embodiments.

Fifth Embodiment

The SOAs of the first to fourth embodiments described above can be applied to a SOA constituting an optical phase modulator.

Figure 28:
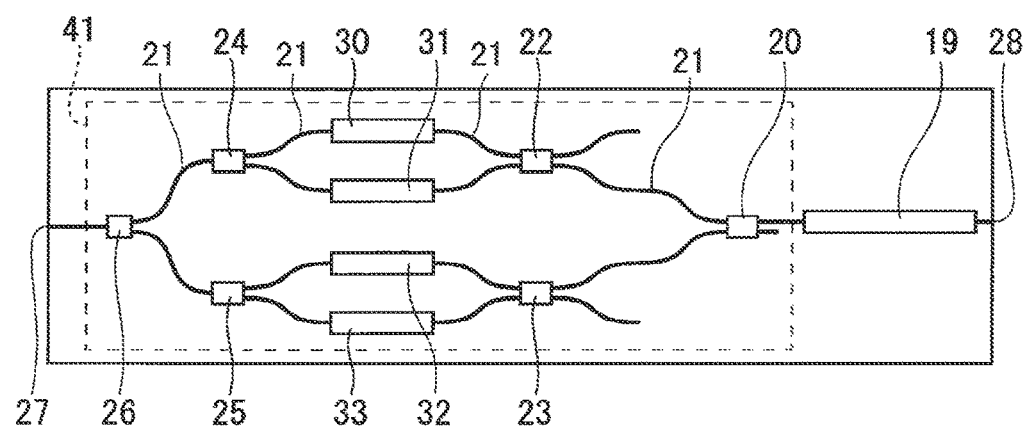
FIG. 28 is a schematic diagram showing a configuration of an optical phase modulator according to a fifth embodiment of the present invention.

FIG. 28 is a schematic diagram showing a configuration of an optical phase modulator 40 according to a fifth embodiment of the present invention. As shown in FIG. 28, the optical phase modulator 40 includes a QPSK phase modulator 41 and an output side SOA 19 for amplifying the output light of the QPSK phase modulator 41, and the light incident end of the output side SOA 19 is the light emission portion 28 of the optical phase modulator 40. It should be noted that the SOAs of the first to fourth embodiments are applied to the output side SOA 19.

In FIG. 28, the QPSK phase modulator 41 is a Mach-Zehnder interferometer type phase modulator in which MMI couplers 20, 22, and 23, MMI splitters 24, 25, and 26, and phase modulation portions 30, 31, 32, and 33 are connected by optical waveguides 21. The phase modulation portions 30 to 33 are known phase modulation waveguides for performing phase-modulation by using the refractive index change generated when a reverse bias voltage is applied to the multiple quantum well (MQW) layer.

The MMI coupler and the MMI splitter are multi mode interference type optical multi/demultiplexing circuits, the MMI splitter 26 shown in FIG. 28 is a one-input two-output 1×2 MMI splitter, splits the light input from the light incident portion 27 of the optical phase modulator 40 into two beams to output them, and inputs the respective outputs into the MMI splitters 24 and 25 via the optical waveguide 21 as demultiplexed light beam. The MMI splitters 24 and 25 are 1×2 MMI splitters, the MMI splitter 24 splits the light input from the MMI splitter 26 into two beams to output them, and inputs the respective outputs into the phase modulation portions 30 and 31 via the optical waveguide 21 as demultiplexed light beam. The MMI splitter 25 splits the light input from the MMI splitter 26 into two beams to outputs them, and inputs the respective outputs into the phase modulation portions 32 and 33 via the optical waveguide 21 as demultiplexed light beam.

Each of the light beams phase-modulated by the phase modulation portions 30 and 31 is input into the MMI coupler 22 via the optical waveguide 21, and each of the light beams phase-modulated by the phase modulation portions 32 and 33 is input into the MMI coupler 23 via the optical waveguide 21.

The MMI coupler 22 is a 2×2 MMI coupler with 2 inputs and 2 outputs, multiplexes the input beams to form the I-modulated light or the Q-modulated light, and inputs it to the MMI coupler 20 via the optical waveguide 21, and the MMI coupler 23 is a 2×2 MMI coupler with 2 inputs and 2 outputs, multiplexes the input beams to form the modulated light different from the modulated light output from the MMI coupler 22 out of the I-modulated light and the Q-modulated light, outputs it, and inputs the output to the MMI coupler 20 via the optical waveguide 21.

The MMI coupler 20 is a 2×2 MMI coupler, multiplexes the I-modulated light and Q-modulated light input from the MMI couplers 22 and 23 to generate QPSK modulated light, and inputs it to the output side SOA 19 via the optical waveguide 21.

It should be noted that in FIG. 28, the electrodes for applying the reverse bias voltage to the phase modulation portions 30 to 33 are omitted.

The optical phase modulator 40 has a rectangular outer shape in FIG. 28, this is also the outer shape of the InP substrate 5 (FIG. 1), and the optical phase modulator 40 is a one-chip element in which the QPSK phase modulator 41 and the output side SOA 19 are formed on the same substrate, and is suitable for miniaturization and simplification of mounting. In addition, since the output light of the optical phase modulator 40 is amplified via the output side SOA 19 that can amplify with low distortion, a low loss phase modulator can be achieved.

<First Modification>

Figure 29:
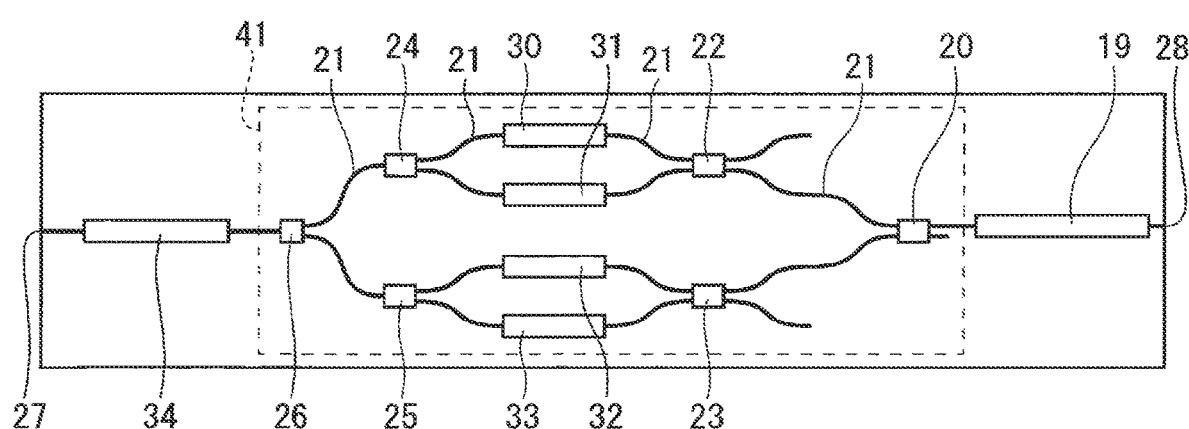
FIG. 29 is a schematic diagram showing a configuration of an optical phase modulator according to a first modification of the fifth embodiment of the present invention.

FIG. 29 is a schematic diagram showing a configuration of an optical phase modulator 40A of a first modification of the fifth embodiment. As shown in FIG. 29, the optical phase modulator 40A has a configuration in which an input side SOA 34 is provided in the optical phase modulator 40 illustrated in FIG. 28. That is, the input side SOA 34 is provided between the light incident portion 27 and the MMI splitter 26 of the optical phase modulator 40A, and the light input into the optical phase modulator 40A is amplified to be input into the QPSK phase modulator 41. It should be noted that an SOA having a general well-known structure can be used as the input side SOA 34.

Thus, although the input side SOA 34 and the output side SOA 19 can share optical amplification, the input side SOA 34 optically amplifies continuous light before phase modulation, so that no phase distortion occurs.

In addition, as compared with the optical phase modulator 40 in FIG. 28, the optical phase modulator 40A can be operated under the condition that the optical amplification gain by the output side SOA 19 is reduced as long as the same light output is achieved. Therefore, for example, decreasing the light confinement coefficient of the active layer in the optical amplification region of the output side SOA 19 in advance allows phase distortion to be further reduced, and a phase modulator with smaller phase distortion to be achieved. For example, if the optical amplification gain of the output side SOA 19 can be reduced from 10 dB to 5 dB, the light confinement coefficient can be reduced to ½.

<Second Modification>

Figure 30:
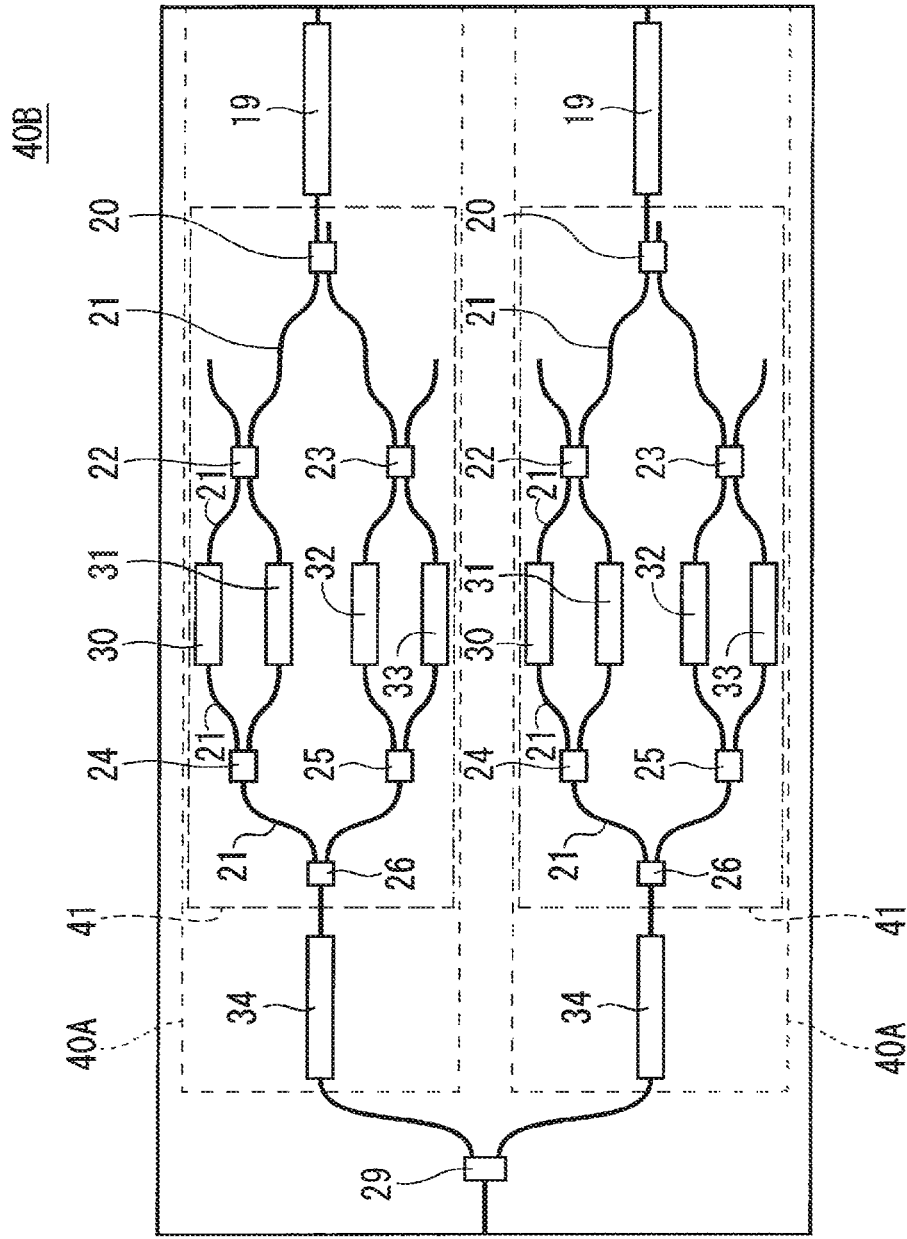
FIG. 30 is a schematic diagram showing a configuration of an optical phase modulator according to a second modification of the fifth embodiment of the present invention.

FIG. 30 is a schematic diagram showing a configuration of an optical phase modulator 40B of a second modification of the fifth embodiment. As shown in FIG. 30, the optical phase modulator 40B has a configuration in which the optical phase modulator 40A described in FIG. 29 is used for two systems.

That is, the emission light beams split into two systems by the 1-input 2-output MMI splitter 29 are made incident on the respective optical phase modulators 40A. In each optical phase modulator 40A, the incident light is amplified by the input side SOA 34 to be input into the QPSK phase modulator 41. As a result, an output signal light beam is obtained from each optical phase modulator 40A, and rotating the polarization direction of one output signal light beam by 90° and then multiplexing the two output signal light beams allows a dual polarization quadrature phase shift keying (DP-QPSK) phase modulator with an amplifier to be formed. It should be noted that the optical polarization rotation portion of the output signal and the subsequent multiplexing portion can be constituted with external optical elements.

As compared with the optical phase modulator 40 in FIG. 28, the optical phase modulator 40B can be operated under the condition that the optical amplification gain by the output side SOA 19 is reduced as long as the same light output is achieved. Therefore, for example, decreasing the light confinement coefficient of the active layer in the optical amplification region of the output side SOA 19 in advance allows phase distortion to be further reduced, and a phase modulator with smaller phase distortion to be achieved.

It should be noted that the optical phase modulator 40B in FIG. 30 is configured to use the optical phase modulator 40A described in FIG. 29 for two systems, but may be configured to use the optical phase modulator 40 described in FIG. 28 for two systems.

<Third Modification>

Figure 31:
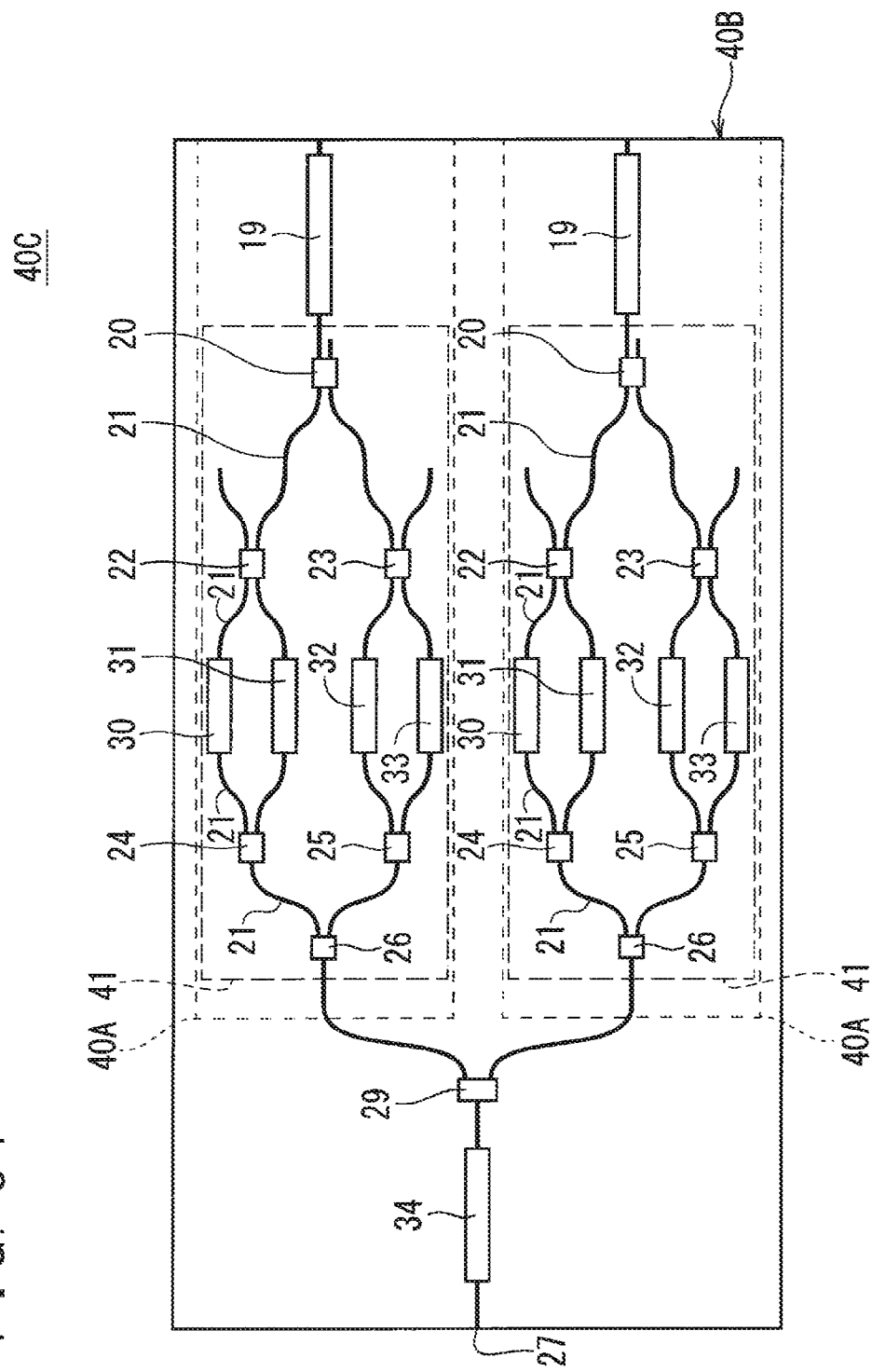
FIG. 31 is a schematic diagram showing a configuration of an optical phase modulator according to a third modification of the fifth embodiment of the present invention.

FIG. 31 is a schematic diagram showing a configuration of an optical phase modulator 40C of a third modification of the fifth embodiment. As shown in FIG. 31, the optical phase modulator 40C has a configuration in which the arrangement of the two input side SOAs 34 indicated by the optical phase modulator 40B in FIG. 30 is changed, the MMI splitter 29 and the two MMI splitters 26 are connected, and an input side SOA 34 is provided between the MMI splitter 29 and the light incident portion 27. The other configuration is the same as that of the optical phase modulator 40B.

As with the optical phase modulator 40B of the second modification shown in FIG. 30, the optical phase modulator 40C can be operated under the condition that the optical amplification gain by the output side SOA 19 is reduced as long as the same optical output is to be achieved. Therefore, for example, decreasing the light confinement coefficient of the active layer in the optical amplification region of the output side SOA 19 in advance allows phase distortion to be further reduced, and a phase modulator with smaller phase distortion to be achieved.

<Fourth Modification>

In the structures of the optical phase modulators 40A, 40B, and 40C described above, in addition to the configuration in which each SOA is individually driven, a configuration may be used in which power is fed in parallel from the same power supply terminal to at least two or more SOAs by connecting electric wiring lines for power supply.

For example, FIG. 32 shows a configuration in which the input side SOA 34 and the output side SOA 19 of the optical phase modulator 40A shown in FIG. 29 are connected in parallel, an n-side SOA power supply terminal 91 is electrically connected to the n-side electrodes of the input side SOA 34 and the output side SOA 19 via the electric wiring line WR, and a p-side SOA power supply terminal 92 is electrically connected to the p-side electrodes of the input side SOA 34 and the output side SOA 19 via the electric wiring line WR. When SOAs are connected in parallel, each SOA is driven with the same applied voltage.

The electric wiring line to be connected may have a configuration in which gold wires are connected by wire bonding, and the optical phase modulator 40 may have a configuration in which the QPSK phase modulator 41, the input side SOA 34, and the output side SOA 19 are connected by a wiring line pattern formed on a substrate on which they are formed.

FIG. 33 shows a configuration in which the input side SOA 34 and the output side SOA 19 of the optical phase modulator 40B shown in FIG. 30 are connected in parallel, an n-side SOA power supply terminal 93 is electrically connected to the n-side electrodes of the input side SOA 34 and the output side SOA 19 of the optical phase modulator 40A on the lower side of the drawing out of the two optical phase modulators 40A via the electric wiring line WR, and a p-side SOA power supply terminal 94 is electrically connected to the p-side electrodes of the input side SOA 34 and the output side SOA 19 via the electric wiring line WR. In addition, an n-side SOA power supply terminal 95 is electrically connected to the n-side electrodes of the input side SOA 34 and the output side SOA 19 of the optical phase modulator 40A on the upper side of the drawing via the electric wiring line WR, and a p-side SOA power supply terminal 96 is electrically connected to the p-side electrodes of the input side SOA 34 and the output side SOA 19 via the electric wiring line WR.

As described above, a configuration of connecting a plurality of SOAs such as an input side SOA and an output side SOA in one optical phase modulator in parallel allows the number of terminals in the case of mounting an optical phase modulator being a one-chip element on a module to be reduced and the module to be miniaturized.

It should be noted that in the present invention, each embodiment can be freely combined, and each embodiment can be appropriately modified, or omitted within the scope of the present invention.

The invention claimed is:

1. A semiconductor optical amplifier provided on a compound semiconductor substrate, the semiconductor optical amplifier comprising:
   a plurality of optical amplification regions arranged in series;
   a passive waveguide region provided between adjacent optical amplification regions; and
   a first electrode and a second electrode provided on an upper surface of each of the adjacent optical amplification regions,
   wherein the passive waveguide region electrically insulates the first electrodes of the adjacent optical amplification regions from each other, electrically insulates the second electrodes of the adjacent optical amplification regions from each other, and optically connects the adjacent optical amplification regions,
   wherein the first electrode of a first of the adjacent optical amplification regions and the second electrode of a second of the adjacent optical amplification regions are connected so that the plurality of optical amplification regions are electrically connected in cascade, and
   wherein power is fed at both ends of the plurality of optical amplification regions thereby driving the plurality of optical amplification regions.

2. The semiconductor optical amplifier according to claim 1, wherein the passive waveguide region has a resistance value higher than a forward resistance value when an active layer waveguide in the plurality of optical amplification regions are driven.

3. The semiconductor optical amplifier according to claim 2,
   wherein, on each of the adjacent optical amplification regions, the first electrode is provided on the upper surface to cover at least an upper part of the active layer waveguide, and
   wherein, on each of the adjacent optical amplification regions, the second electrode is provided on the upper surface at a position apart from the active layer waveguide.

4. The semiconductor optical amplifier according to claim 3,
   wherein, on each of the adjacent optical amplification regions, the first electrode is provided to extend from above the active layer waveguide to a portion of the upper surface on a side opposite to the second electrode with the active layer waveguide interposed between the second electrode and the first electrode, and
   wherein the first electrodes and the second electrodes are provided to be reversely arranged between the adjacent optical amplification regions.

5. The semiconductor optical amplifier according to claim 1,
   wherein each of the plurality of optical amplification regions has a different region length along an arrangement direction,
   wherein an optical amplification region having the longest region length is arranged to be closest to a light incident end side of the semiconductor optical amplifier, and
   wherein an optical amplification region having the shortest region length is arranged to be closest to a light emission end side of the semiconductor optical amplifier.

6. The semiconductor optical amplifier according to claim 1, wherein each of the plurality of optical amplification regions include an active layer waveguide in a tapered shape in which a width of an active layer waveguide of an optical amplification region arranged closest to a light emission end side of the semiconductor optical amplifier is wider than a width of an active layer waveguide of an optical amplification region arranged closest to a light incident end side.

7. The semiconductor optical amplifier according to claim 1,
wherein, in the plurality of optical amplification regions, a light confinement coefficient of an active layer waveguide in at least one optical amplification region is different from a light confinement coefficient of an active layer waveguide in another optical amplification region, and
wherein an optical amplification region including an active layer waveguide having the smallest light confinement coefficient is arranged closest to a light emission end side of the semiconductor optical amplifier.

8. The semiconductor optical amplifier according to claim 7, wherein the active layer waveguide having the smallest light confinement coefficient has the smallest thickness of the active layers.

9. The semiconductor optical amplifier according to claim 1,
further comprising a spot size converter including a transparent waveguide whose waveguide width is reduced in a reverse tapered shape with respect to a traveling direction of light, and
wherein the spot size converter is connected to a light emission end of the semiconductor optical amplifier.

10. A method for manufacturing the semiconductor optical amplifier according to claim 1, the method comprising:
forming a multilayer film of a compound semiconductor including an active layer on the compound semiconductor substrate, and then removing the multilayer film in a region forming the passive waveguide region; and
forming a transparent waveguide to be butt-joint coupled with the active layer by butt joint growth in a region from which the multilayer film is removed to form the passive waveguide region.

11. A method for manufacturing the semiconductor optical amplifier according to claim 1, the method comprising:
forming a multilayer film of a compound semiconductor including an active layer on the compound semiconductor substrate and then selectively implanting protons or helium ions into the multilayer film in a region in which the passive waveguide region is formed, and
forming an ion implantation region in the active layer and a multilayer film of the compound semiconductor above and below the active layer to form the passive waveguide region.

12. An optical phase modulator comprising:
a quadrature phase shift keying (QPSK) phase modulator configured to:
split incident light into a first demultiplexed light beam and a second demultiplexed light beam,
split the first demultiplexed light beam into a third demultiplexed light beam and a fourth demultiplexed light beam,
split the second demultiplexed light beam into a fifth demultiplexed light beam and a sixth demultiplexed light beam,
modulate at least one of the third demultiplexed light beam and the fourth demultiplexed light beam and then to multiplex the demultiplexed light beams to form I modulated light,
modulate at least one of the fifth demultiplexed light beam and the sixth demultiplexed light beam and then to multiplex the demultiplexed light beams to form Q modulated light,
multiplex the I modulated light and Q modulated light to generate QPSK modulated light; and
an output side semiconductor optical amplifier configured to amplify emission light of the QPSK phase modulator,
wherein the output side semiconductor optical amplifier includes the semiconductor optical amplifier according to claim 1, and
wherein the QPSK phase modulator is provided on the same compound semiconductor substrate as that of the output side semiconductor optical amplifier.

13. The optical phase modulator according to claim 12, further comprising an input side semiconductor optical amplifier provided on an optical input side of the QPSK phase modulator, the input side semiconductor optical amplifier configured to amplify incident light to input the amplified light into the QPSK phase modulator.

14. The optical phase modulator according to claim 13, wherein power is supplied in parallel to the input side semiconductor optical amplifier and the output side semiconductor optical amplifier.

15. An optical phase modulator comprising:
a first optical phase modulator; and
a second optical phase modulator,
wherein the first and the second optical phase modulators are configured as the optical phase modulator according to claim 12,
incident light is split into beams and the beams are input to the first and second optical phase modulators, and
respective signal light beams are output from the first and second optical phase modulators.

16. The optical phase modulator according to claim 15, further comprising an input side semiconductor optical amplifier configured to amplify incident light to input the amplified light into the first and the second optical phase modulators,
wherein power is supplied in parallel to the input side semiconductor optical amplifier and the output side semiconductor optical amplifier.

17. An optical phase modulator comprising:
a first optical phase modulator;
a second optical phase modulator; and
an input side semiconductor optical amplifier configured to amplify incident light to input the amplified light into the first and the second optical phase modulators,
wherein one of the first and the second optical phase modulators includes the optical phase modulator according to claim 12,
wherein emission light of the input side semiconductor optical amplifier is split into beams and the beams are input to the first and second optical phase modulators, and
wherein respective signal light beams are output from the first and second optical phase modulators.

18. The optical phase modulator according to claim 17, wherein power is supplied in parallel to the input side semiconductor optical amplifier and the output side semiconductor optical amplifier.

* * * * *